(12) United States Patent
Nakanishi

(10) Patent No.: US 10,115,795 B2
(45) Date of Patent: Oct. 30, 2018

(54) SEMICONDUCTOR DEVICE AND METHOD OF MANUFACTURING SAME

(71) Applicant: RENESAS ELECTRONICS CORPORATION, Tokyo (JP)

(72) Inventor: Sho Nakanishi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/423,283

(22) Filed: Feb. 2, 2017

(65) Prior Publication Data

US 2017/0229551 A1  Aug. 10, 2017

(30) Foreign Application Priority Data

Feb. 5, 2016  (JP) .................................. 2016-020383

(51) Int. Cl.
*H01L 29/40* (2006.01)
*H01L 29/06* (2006.01)
(Continued)

(52) U.S. Cl.
CPC .......... *H01L 29/405* (2013.01); *H01L 29/063* (2013.01); *H01L 29/404* (2013.01);
(Continued)

(58) Field of Classification Search
CPC ... H01L 29/405; H01L 29/063; H01L 29/404; H01L 29/41708; H01L 29/6634; H01L 29/66348; H01L 29/66734; H01L 29/7397; H01L 29/7398; H01L 29/7809; H01L 29/7811; H01L 29/7813
See application file for complete search history.

(56) References Cited

U.S. PATENT DOCUMENTS 5,053,743 A * 10/1991 Mille ...................... H01L 29/36
                                                                257/379
6,828,645 B2 * 12/2004 Jimbo ................. H01L 27/0611
                                                                257/488

(Continued)

FOREIGN PATENT DOCUMENTS

JP       2003-031791 A    1/2003
WO    2012/157223 A1  11/2012

*Primary Examiner* — Sitaramarao S Yechuri
(74) *Attorney, Agent, or Firm* — McDermott Will & Emery LLP

(57) ABSTRACT

To provide a highly reliable semiconductor device having both an improved breakdown voltage and a reduced withstand voltage leakage current. An intermediate resistive field plate is comprised of a first intermediate resistive field plate coupled, at one end thereof, to an inner-circumferential-side resistive field plate and, at the other end, to an outer-circumferential-side resistive field plate and a plurality of second intermediate resistive field plates. The first intermediate resistive field plate has a planar pattern that is equipped with a plurality of first portions separated from each other in a first direction connecting the inner-circumferential resistive field plate to the outer-circumferential-side resistive field plate and linearly extending in a second direction orthogonal to the first direction, and repeats reciprocation along the second direction. The second intermediate resistive field plates are each connected with a first end portion on one side of the first portions and extend with a curvature.

18 Claims, 22 Drawing Sheets

(51) Int. Cl.
*H01L 29/417* (2006.01)
*H01L 29/66* (2006.01)
*H01L 29/739* (2006.01)
*H01L 29/78* (2006.01)
*H01L 29/10* (2006.01)

(52) U.S. Cl.
CPC .... *H01L 29/41708* (2013.01); *H01L 29/6634* (2013.01); *H01L 29/66348* (2013.01); *H01L 29/66734* (2013.01); *H01L 29/7397* (2013.01); *H01L 29/7398* (2013.01); *H01L 29/7809* (2013.01); *H01L 29/7811* (2013.01); *H01L 29/7813* (2013.01); *H01L 29/1095* (2013.01); *H01L 29/41766* (2013.01); *H01L 29/66727* (2013.01)

(56) References Cited

U.S. PATENT DOCUMENTS

| | | | |
|---|---|---|---|
| 9,240,445 B2 | 1/2016 | Suzuki et al. | |
| 2003/0047776 A1* | 3/2003 | Hueting | H01L 29/0696 257/328 |
| 2007/0120224 A1* | 5/2007 | Ranjan | H01L 23/585 257/537 |
| 2010/0289110 A1* | 11/2010 | Tarui | H01L 29/0619 257/490 |
| 2011/0115033 A1* | 5/2011 | Tamaki | H01L 29/0619 257/409 |
| 2011/0140165 A1* | 6/2011 | Kusunoki | H01L 27/0658 257/139 |
| 2011/0204469 A1* | 8/2011 | Onishi | H01L 29/0619 257/490 |
| 2014/0048911 A1* | 2/2014 | Suzuki | H01L 29/404 257/629 |
| 2014/0077329 A1* | 3/2014 | Abe | H01L 29/404 257/488 |
| 2015/0001677 A1* | 1/2015 | Palumbo | H01L 29/405 257/536 |
| 2015/0008539 A1* | 1/2015 | Kanda | H01L 29/402 257/409 |
| 2016/0300912 A1* | 10/2016 | Tanaka | H01L 29/405 |
| 2017/0294526 A1* | 10/2017 | Storasta | H01L 29/7395 |

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2016-020383 filed on Feb. 5, 2016 including the specification, drawings, and abstract is incorporated herein by reference in its entirety.

BACKGROUND

The present invention relates to a semiconductor device and a manufacturing technology thereof, for example, those suited for use in a power semiconductor device equipped with a resistive field plate.

Japanese Unexamined Patent Application Publication No. 2003-31791 (Patent Document 1) discloses a resistive field plate comprised of a first annular portion on an inner circumferential side, a second annular portion on an outer circumferential side, a plurality of trunk portions between them, and branch portions projecting laterally from the respective trunk portions. The branch portions do not allow passage of a steady current, thus reducing a leakage current.

WO2012/157223 (Patent Document 2) discloses a lateral semiconductor device having a first portion and a second portion adjacent to each other along a circumferential direction around a first semiconductor region and equipped with a resistive field plate comprised of first and second resistive field plate portions provided in the first and second portions, respectively. The first resistive field plate portion and the second resistive field plate portion are separated from each other.

PATENT DOCUMENTS

[Patent Document 1] Japanese Unexamined Patent Application Publication No. 2003-31791
[Patent Document 2] WO2012/157223

SUMMARY

Power semiconductor devices have a resistive field plate in order to have an improved peripheral breakdown voltage. The resistive field plate however has a drawback that it has difficulty in achieving both improvement in breakdown voltage and reduction in withstand voltage leakage current.

Another problem and novel features will be apparent from the description herein and accompanying drawings.

In one embodiment, there is provided a semiconductor device having an active portion provided at the center portion of a semiconductor substrate, a peripheral portion provided around the active portion, and a resistive field plate provided in the peripheral portion and enclosing the active portion. The resistive field plate is comprised of an inner-circumferential-side resistive field plate, an outer-circumferential-side resistive field plate, and an intermediate resistive field plate provided between the inner-circumferential-side resistive field plate and the outer-circumferential-side resistive field plate. The intermediate resistive field plate is comprised of a first intermediate resistive field plate and a plurality of second intermediate resistive field plates. The first intermediate resistive field plate is coupled, at one end thereof, to the inner-circumferential-side resistive field plate and the first intermediate resistive field plate is coupled, at the other end thereof, to the outer-circumferential-side resistive field plate. The first intermediate resistive field plate has a planar pattern that is equipped with a plurality of first portions separated from each other in a first direction connecting the inner-circumferential-side resistive field plate with the outer-circumferential-side resistive field plate and at the same time, extending linearly in a second direction orthogonal to the first direction, and repeats reciprocation along the second direction. The second intermediate resistive field plates connect with a first end portion on one side of the first portions, respectively, and extend with a curvature.

The above-described embodiment can provide a high-reliability semiconductor device by achieving both improvement in breakdown voltage and reduction in withstand voltage leakage current.

DETAILED DESCRIPTION OF THE DRAWINGS

DETAILED DESCRIPTION

Figure 1:
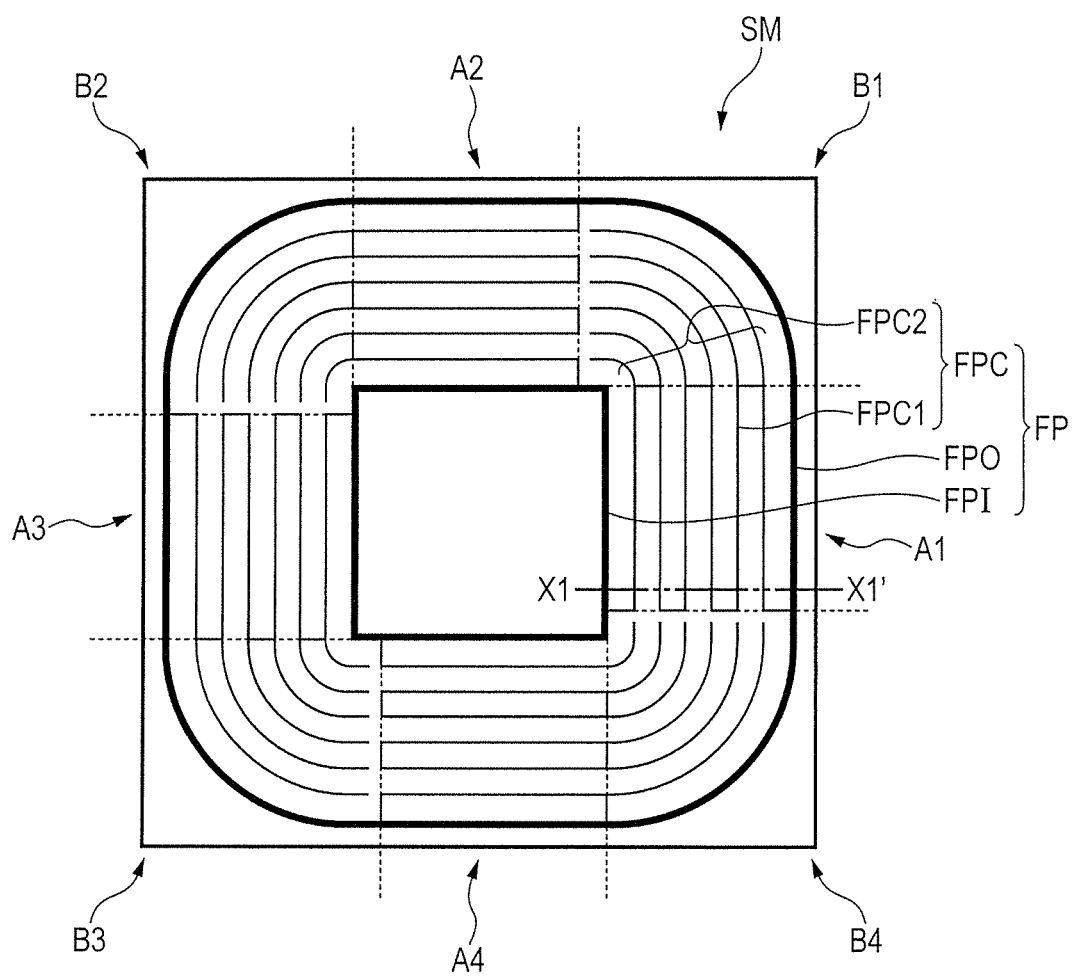
FIG. 1 is a plan view showing a resistive field plate formed in the peripheral portion of a semiconductor device of First Embodiment.

In the below-described embodiments, a description will be made after divided in a plurality of sections or embodiments if necessary for the sake of convenience. These sections or embodiments are not independent from each other unless otherwise particularly specified, but one of them may be a modification example, application example, detailed description, complementary description, or the like of a part or whole of the other one.

In the below-described embodiments, when a reference is made to the number or the like (including the number, value, amount, range, or the like) of components, the number is not limited to a specific number but may be more or less than the specific number, unless otherwise specifically indicated or principally apparent that the number is limited to the specific number.

Further, in the below-described embodiments, it is needless to say that constituent components (including constituent steps or the like) are not always essential unless otherwise specifically indicated or principally apparent that they are essential. Similarly, in the below-described embodiments, when a reference is made to the shape, positional relationship, or the like of the constituent components, that substantially approximate or analogous to it is also embraced unless otherwise specifically indicated or principally apparent that it is not. This also applies to the above-described number or the like (including the number, value, amount, range or the like).

The embodiment will hereinafter be described in detail based on the drawings. In all the drawings for describing the following embodiment, members of a like function will be identified by like or related reference numerals and overlapping descriptions will be omitted. When there is a plurality of analogous members (sites), a sign may be added to a generic reference numeral to show an individual or specific site. Further, in the below-described embodiment, a description on the same or similar portion will not be repeated in principle unless otherwise particularly necessary.

In the drawings to be used in the embodiment, hatching may be omitted even from a cross-sectional view in order to facilitate viewing of them. Further, hatching may be added to even a plan view in order to facilitate viewing of it.

In a cross-sectional view and a plan view, the dimensions of each site do not correspond to those of an actual device. To facilitate understanding of the drawing, a specific site is sometimes displayed on a relatively large scale. Even when a cross-sectional view and a plan view correspond to each other, a specific site may be shown on a relatively large scale to facilitate understanding of it.

The symbol "−" and "+" as used herein means a relative concentration of an impurity having an N conductivity type or a P conductivity type. For example, the concentration of an N type impurity is higher in the following order: "N$^{--}$", "N", and "N$^{+}$", while the concentration of a P type impurity is higher in the following order "P$^{-}$", "P", "P$^{+}$", and "P$^{++}$".

(Detailed Description of the Problem)

In order to make clear the structure of a resistive field plate which the power semiconductor device of the present embodiment has, the inconvenience of the resistive field plate found by the present inventors will hereinafter be described. Here, IGBT (insulated gate bipolar transistor) is exemplified as a power semiconductor element, but not only it but also, for example, diode, power MOSFET (metal oxide semiconductor field effect transistor) or RC-IGBT (reverse conducting IGBT) may be used.

A resistive field plate is a field plate that couples between a first electrode and a second electrode (between a collector electrode and an emitter electrode in a semiconductor device equipped with an IGBT element) by a conductor layer made of, for example, polycrystalline silicon (Si) and a constant potential distribution formed by supplying an electric current to the conductor layer is used for securing a peripheral breakdown voltage.

Figure 21A:
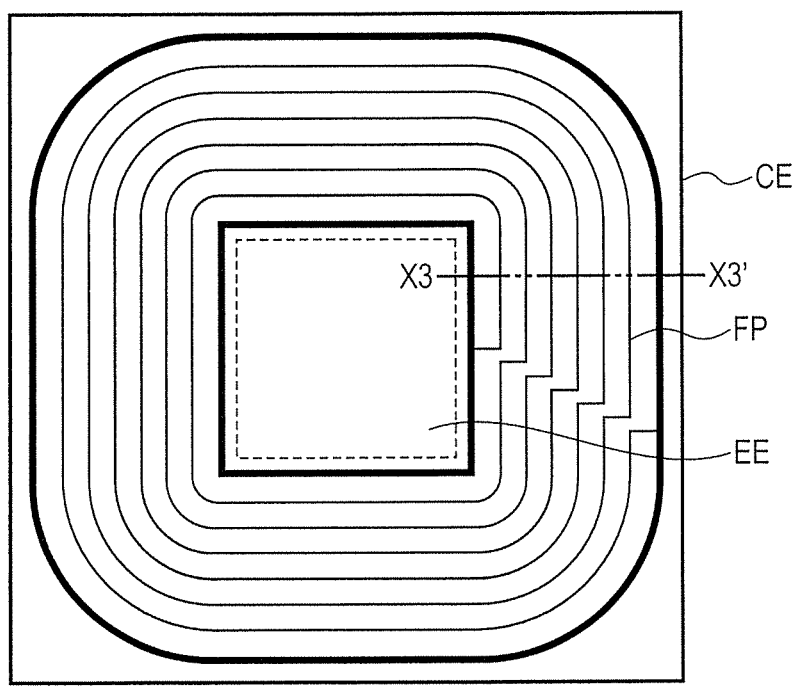
FIG. 21A is a plan view of a semiconductor device showing a resistive field plate compared and investigated by the present inventors and FIG. 21B is a graph showing a potential distribution of the resistive field plate taken along the line X3-X3' of FIG. 21A.
Figure 21B:
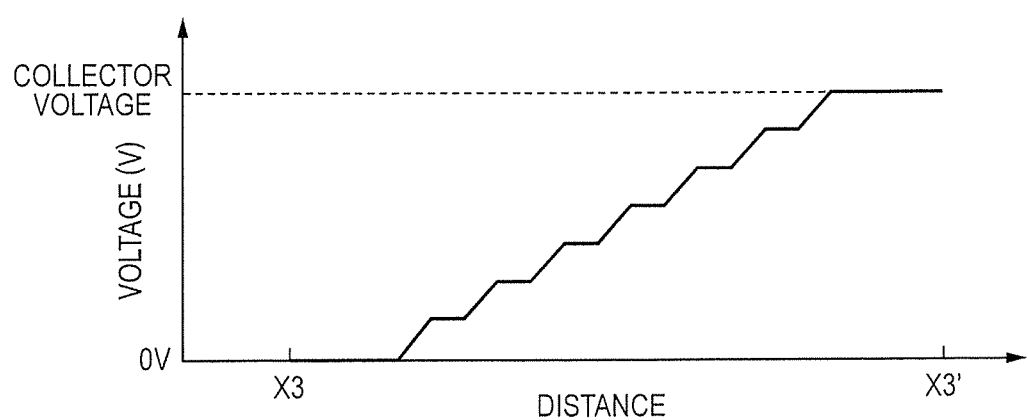
Figure 22:
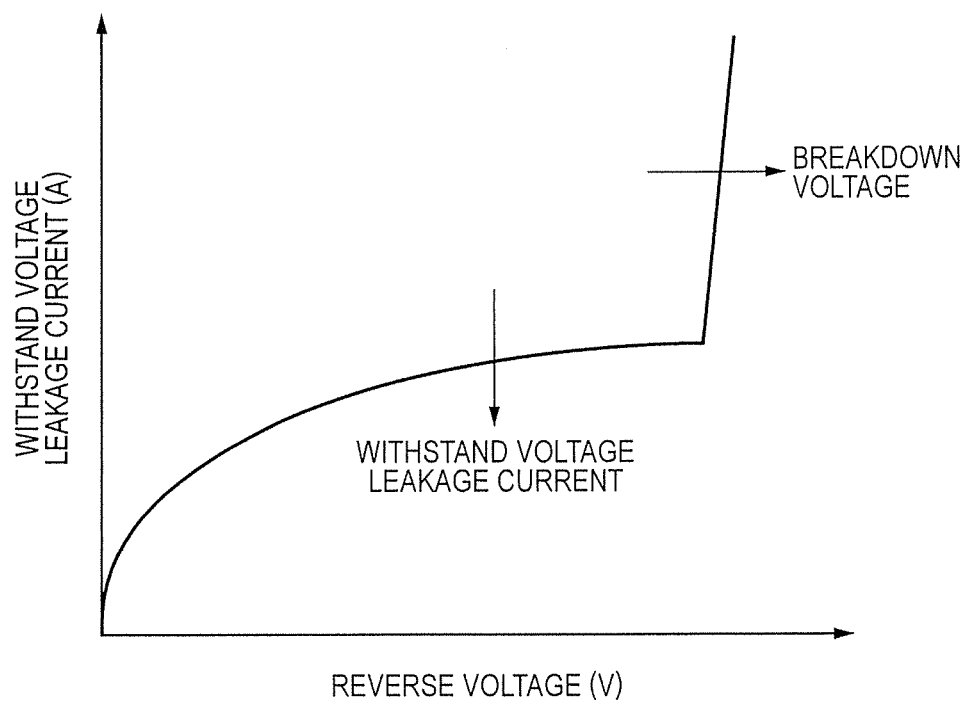
FIG. 22 is a graph describing the relationship of a semiconductor device between a withstand voltage leakage current and a reverse voltage.
Figure 23:
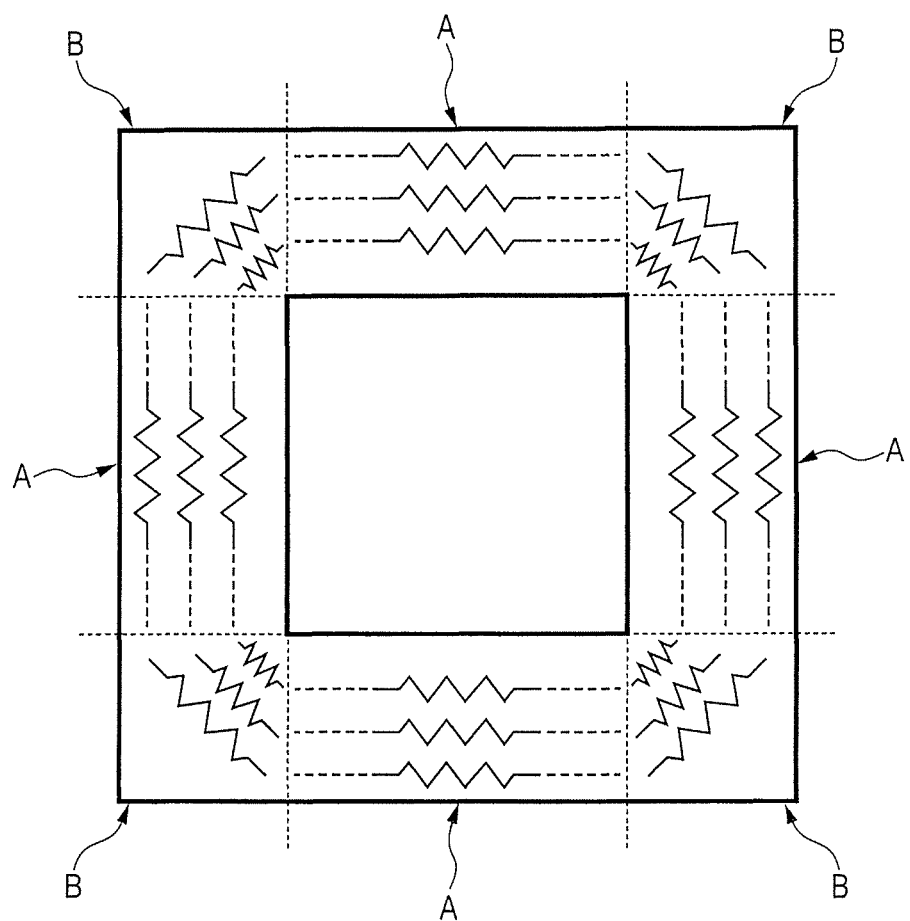
FIG. 23 is a plan view of a semiconductor device schematically showing a resistive component of a resistive field plate.

FIG. 21A is a plan view of a semiconductor device showing a resistive field plate compared and investigated by the present inventors and FIG. 21B is a graph showing the potential distribution of the resistive field plate taken along the line X3-X3' of FIG. 21A. FIG. 22 is a graph describing the relationship of the semiconductor device between a breakdown voltage leakage current and a reverse voltage. FIG. 23 is a plan view of a semiconductor device schematically showing resistive components of the resistive field plate.

As shown in FIG. 21A, the semiconductor device equipped with an IGBT element has an emitter electrode EE formed at the center portion of the device in plan view and a collector electrode CE formed in the peripheral portion of the device in plan view, separated from the emitter electrode EE. The emitter electrode EE and the collector electrode CE have therebetween a resistive field plate FP which spirally surrounds the emitter electrode EE and is made of polycrystalline silicon (Si). Although not shown in this drawing, it is electrically coupled, at one end thereof, to the collector electrode CE and, at the other end, the emitter electrode EE.

As shown in FIG. 21B, when a collector voltage is applied to the collector electrode CE and, for example, 0 V is applied to the emitter electrode EE, with respect to the voltage applied to the resistive field plate FP, a potential is divided in accordance with the number of the orbits of the resistive field plate FP, thus causing a gradient of a potential linearly decreasing from one end side (collector electrode CE side) to the other end side (emitter electrode EE side) of the resistive field plate FP. This improves the extension of a depletion layer from a PN junction and relaxes the field concentration of the PN junction or peripheral portion. As a result, the semiconductor device can have improved withstand voltage characteristics.

As shown in FIG. 22, semiconductor devices are required to have high breakdown voltage and low withstand voltage leakage current as their withstand voltage characteristics. The breakdown voltage is determined by the electric field distribution at the corner portion of a resistive field plate having a curvature. At the corner portion compared with a linear portion, uniform extension of a depletion layer is disturbed and electric field concentration is likely to occur. In addition, when the resistive field plate has a curvature, the electric field distribution of the resistive field plate becomes uneven and electric field concentration is likely to occur more easily, which also has an influence on the reduction in breakdown voltage. On the other hand, the withstand voltage leakage current is determined by the resistance of the resistive field plate, that is, the impurity concentration and size of polycrystalline silicon (Si) configuring the resistive field plate.

(1) First Problem of Resistive Field Plate

As shown in FIG. 23, at the corner portion B of a resistive field plate having a curvature, the resistive field plate has an increased length and has an increased resistance as it approaches to the outer circumference because of a difference in curvature radius among orbits. At the corner portion B, therefore, the potential allocation differs among the orbits and the potential distribution becomes uneven between the inner circumferential side and the outer circumferential side. This may cause a reduction in breakdown voltage of a semiconductor device.

At the linear portion A of the resistive field plate where it is linear, the resistance only at the linear portion A becomes fixed but is inevitably influenced by the potential allocation at the corner portion B so that the potential allocation among the orbits in this portion is similar to that in the corner portion B and the electric field distribution becomes uneven.

(2) Second Problem of Resistive Field Plate

In order to increase the breakdown voltage of a semiconductor device, it is desired to make uniform the electric field distribution on the inner circumferential side and that on the outer circumferential side at the corner portion of the resistive field plate. To achieve this, it is necessary to increase the concentration of polycrystalline silicon (Si) configuring the resistive field plate and thereby decrease the resistance of the resistive field plate.

On the other hand, in order to decrease a withstand voltage leakage current of a semiconductor device, it is necessary to decrease the concentration of polycrystalline silicon (Si) configuring the resistive field plate or increase the number of orbits and thereby increase the resistance of the resistive field plate.

In the spiral planar layout of a resistive field plate FP investigated by the present inventors and shown in FIG. 21A, a breakdown voltage and a withstand voltage leakage current cannot be achieved simultaneously because they are in a trade-off relationship. For example, a decrease in the impurity concentration of polycrystalline silicon (Si) configuring the resistive field plate in order to reduce a withstand voltage leakage current causes a decline in breakdown voltage due to an increase in difference in resistance at the corner portion among orbits.

In the above-described Patent Document 1, the resistive field plate is comprised of a belt-like trunk portion extending from an inside electrode to an outside electrode and a plurality of branch portions branching from the belt-like trunk portion and in a steady state, the leakage current is reduced by supplying an electric current flowing through the resistive field pate to the belt-like trunk portion. However, the inside electrode and the outside electrode are connected to each other with the linear belt-like trunk portion so that a leakage current reduction effect is presumed to be not so large.

In the above-described Patent Document 2, a high breakdown voltage diode is actualized by forming resistive field plates separated from each other in a corner portion and a linear portion, respectively, and placing the resistive field plates in the corner portion and the linear portion at the same interval with respect to a horizontal-direction length of a drift region and thereby relaxing the surface field of the drift region. The resulting diode however may have a reduced breakdown voltage because the potential allocation differs among orbits in the corner portion and the electric field distribution becomes uneven between the inner circumferential side and the outer circumferential side.

(First Embodiment)

<Peripheral Structure of Semiconductor Device>

The planar layout of a resistive field plate according to First Embodiment will be described referring to FIG. 1. FIG. 1 is a plan view showing a resistive field plate formed in the peripheral portion of a semiconductor device of First Embodiment.

As shown in FIG. 1, a semiconductor device SM has, in plan view, a square shape. The semiconductor device SM has, at the center portion thereof, an IGBT element and the semiconductor device SM has, in the peripheral portion thereof, a resistive field plate FP formed so as to surround the active portion in plan view. In the following description, the center portion where the IGBT has been formed will be called "active portion" or "cell portion."

The resistive field plate FP has an inner-circumferential-side resistive field plate FPI, an outer-circumferential-side resistive field plate FPO, and an intermediate resistive field plate FPC.

The inner-circumferential-side resistive field plate FPI is placed so as to enclose the active portion and is electrically coupled to an emitter electrode (refer to FIG. 2) which will be described later. The outer-circumferential-side resistive field plate FPO is placed on the outer circumferential side of a semiconductor substrate than the inner-circumferential-side resistive field plate FPI, separated from the inner-circumferential-side resistive field plate FPI. It is placed so as to enclose the active portion and is electrically coupled to a surface collector electrode (refer to FIG. 2) which will be described later.

The intermediate resistive field plate FPC is placed between the inner-circumferential-side resistive field plate FPI and the outer-circumferential-side resistive field plate FPO and is coupled to both the inner-circumferential-side resistive field plate FPI and the outer-circumferential-side resistive field plate FPO. In First Embodiment, the inner-circumferential-side resistive field plate FPI and the outer-circumferential-side resistive field plate FPO have therebetween four intermediate resistive field plates FPC coupled in parallel.

The peripheral portion of the semiconductor substrate is, in plan view, divided into eight portions, that is, four linear portions A1, A2, A3, and A4 located along four sides of the semiconductor substrate, respectively, and four corner portions B1, B2, B3, and B4 located on two diagonal lines of the semiconductor substrate. The linear portion A1, the corner portion B1, the linear portion A2, the corner portion B2, the linear portion A3, the corner portion B3, the linear portion A4, and the corner portion B4 are arranged around the active portion in this order.

One intermediate resistive field plate FPC is comprised of a first intermediate resistive field plate FPC1 formed in the linear portion A1 and a plurality of second intermediate resistive field plates FPC2 formed in the corner portion B1. Other three intermediate resistive field plates FPC have a similar structure.

Described specifically, a first intermediate resistive field plate FPC1 formed in the linear portion A2 and a plurality of second intermediate resistive field plates FPC2 formed in the corner portion B2 configure another intermediate resistive field plate FPC. A first intermediate resistive field plate FPC1 formed in the linear portion A3 and a plurality of second intermediate resistive field plates FPC2 formed in the corner portion B3 configure a further intermediate resistive field plate FPC. A first intermediate resistive field plate FPC1 formed in the linear portion A4 and a plurality of second intermediate resistive field plates FPC2 formed in the corner portion B4 configure a still further intermediate resistive field plate FPC.

The first intermediate resistive field plates FPC1 formed in the linear portions A1, A2, A3, and A4, respectively, have, between the inner-circumferential-side resistive field plate FPI and the outer-circumferential-side resistive field plate FPO, a planar pattern that repeats reciprocation along a second direction orthogonal to a first direction connecting between the inner-circumferential-side resistive field plate FPI and the outer-circumferential-side resistive field plate FPO. Each of them is coupled to, at one end portion thereof, the inner-circumferential-side resistive field plate FPI and, at the other end portion, the outer-circumferential-side resistive field plate FPO. In other words, the first intermediate resistive field plate FPC1 is comprised of a plurality of first portions extending linearly in the second direction and a plurality of second portions connecting respective one end portions of two first portions or the respective other end portions of them adjacent to each other.

The four first intermediate resistive field plates FPC1 are, at one end thereof, coupled to the inner-circumferential-side resistive field plate FPI at equal intervals along the inner-circumferential-side resistive field plate FPI.

In FIG. 1, the first intermediate resistive field plate FPC1 reciprocates three times between the inner-circumferential-side resistive field plate FPI and the outer-circumferential-side resistive field plate FPO and therefore it has six first portions.

The first intermediate resistive field plates FPC1 have a fixed width and the first portions of the first intermediate resistive field plates FPC1 have an equal length. When viewed in the first direction connecting the inner-circumferential-side resistive field plate FPI and the outer-circumferential-side resistive field plate FPO, the first portions of the first intermediate resistive field plates FPC1 are placed at an equal pitch. The term "equal" as used herein does not mean "completely equal", but means "substantially equal" or "almost equal", taking into consideration a predetermined range including variation.

By such a structure, the voltage applied to the first intermediate resistive field plate FPC1 is dispersed in accordance with the reciprocation times of the first intermediate resistive field plate FPC1 and there occurs a potential gradient in which the voltage linearly decreases from the outer-circumferential-side resistive field plate FPO side to the inner-circumferential-side resistive field plate FP1 side, as shown in FIG. 21B.

The plurality of second intermediate resistive field plates FPC2 formed in the corner portions B1, B2, B3, and B4, respectively, is, at one end portion thereof, connected to the end portion on one side of the plurality of first portions of the first intermediate resistive field plates FPC1 formed in the linear portions A1, A2, A3, and A4, respectively and extends with a curvature like a branch in one direction. On the other hand, the plurality of second intermediate resistive field plates FPC2 is, at the other end portion (tip portion) thereof, opened.

In FIG. 1, second intermediate resistive field plates FPC2 are connected to the six first portions of the first intermediate resistive field plate FPC1 formed in the linear portion A1 and the six second intermediate resistive field plates FPC2 are formed with a curvature in the corner portion B1.

Similarly, second intermediate resistive field plates FPC2 are connected to the six first portions of the first intermediate resistive field plate FPC1 formed in the linear portion A2 and the six second intermediate resistive field plates FPC2 are formed with a curvature in the corner portion B2.

Similarly, second intermediate resistive field plates FPC2 are connected to the six first portions of the first intermediate resistive field plate FPC1 formed in the linear portion A3 and the six second intermediate resistive field plates FPC2 are formed with a curvature in the corner portion B3.

Similarly, second intermediate resistive field plates FPC2 are connected to the six first portions of the first intermediate resistive field plate FPC1 formed in the linear portion A4 and the six second intermediate resistive field plates FPC2 are formed with a curvature in the corner portion B4.

The plurality of second intermediate resistive field plates FPC2 has a fixed width and the width is equal to that of the first intermediate resistive field plate FPC1. The plurality of second intermediate resistive field plates FPC2 has a pitch equal to that of the plurality of first portions of the first intermediate resistive field plate FPC1.

In the resistive field plate FP according to First Embodiment, the plurality of second intermediate resistive field plates FPC2 formed in the corner portions B1, B2, B3, and B4, respectively, is not connected directly to the inner-circumferential-side resistive field plate FPI or the outer-circumferential-side resistive field plate FPO. In thermal equilibrium, therefore, an electric current flows through only the first intermediate resistive field plate FPC1 and does not flow through the second intermediate resistive field plates FPC2. It is therefore not influenced by a difference in resistance caused by a difference in curvature radius.

Further, the plurality of second intermediate resistive field plates FPC2 can make use of the potential of the first portions of the first intermediate resistive field plate FPC1 to which the second intermediate resistive field plates FPC2 are connected, respectively. The potential of the second intermediate resistive field plates FPC2 becomes equal to that of the first portions of the first intermediate resistive field plate FPC1 to which the second intermediate resistive field plates FPC2 are connected, respectively, so that the electric field distribution can be made uniform among the orbits even in the corner portions B1, B2, B3, and B4.

In the resistive field plate FP, therefore, the electric field distribution becomes uniform among the orbits and the semiconductor device SM can be prevented from decline in breakdown voltage.

Further, the opened tip portion of the plurality of second intermediate resistive field plates FPC2 formed in the corner portions B1, B2, B3, and B4, respectively, has a linear shape.

In FIG. 1, for example, the corner portion B1 has a first side and a second side of a semiconductor substrate which are orthogonal to each other and the linear portion A1 placed along the first side and the linear portion A2 placed along the second side are in contact with this corner portion B1. The plurality of second intermediate resistive field plates FPC2 formed in the corner portion B1 are, at one end portion thereof, connected to the plurality of first portions of the first intermediate resistive field plate FPC1 formed in the linear portion A1. The plurality of second intermediate resistive field plates FPC2 formed in the corner portions B1 extend, at the other end portion (opened tip portion) thereof, in a direction same as that of the plurality of first portions of the first intermediate resistive field plate FPC1 formed in the linear portion A2 and has a linear form.

The respective opened tip portions of the plurality of second intermediate resistive field plates FPC2 formed in the corner portion B1 extend in the direction of the linear portion A2 and have a linear shape so as to face the plurality of first portions of the first intermediate resistive field plate FPC1 formed in the linear portion A2.

Similarly, the respective opened tip portions of the plurality of second intermediate resistive field plates FPC2 formed in the corner portion B2 extend in the direction of the linear portion A3 and have a linear shape so as to face the plurality of first portions of the first intermediate resistive field plate FPC1 formed in the linear portion A3.

Similarly, the respective opened tip portions of the plurality of second intermediate resistive field plates FPC2 formed in the corner portion B3 extend in the direction of the linear portion A4 and have a linear shape so as to face the plurality of first portions of the first intermediate resistive field plate FPC1 formed in the linear portion A4.

Similarly, the respective opened tip portions of the plurality of second intermediate resistive field plates FPC2 formed in the corner portion B4 extend in the direction of the linear portion A1 and have a linear shape so as to face the plurality of first portions of the first intermediate resistive field plate FPC1 formed in the linear portion A1.

Thus, a risk of decline in breakdown voltage attributable to the planar layout, shape, or manufacturing process of the resistive field plate FP can be suppressed to the minimum by making linear the opened tip portion of the plurality of second intermediate resistive field plates FPC2 not connected with the plurality of first portions of the first intermediate resistive field plate FPC1.

A reduction in withstand voltage leakage current can be achieved by reducing the impurity concentration of polycrystalline silicon (Si) configuring the resistive field plate FP. In thermal equilibrium, an electric current does not flow through the plurality of second intermediate resistive field plates FPC2 formed in the corner portions B1, B2, B3, and B4 so that the impurity concentration of polycrystalline silicon (Si) configuring the resistive field plate FP can be adjusted as an independent parameter.

Accordingly, the semiconductor device SM equipped with the resistive field plate FP having a planar layout according to First Embodiment can have an improved breakdown voltage and at the same time, have a reduced withstand voltage leakage current.

Figure 2:
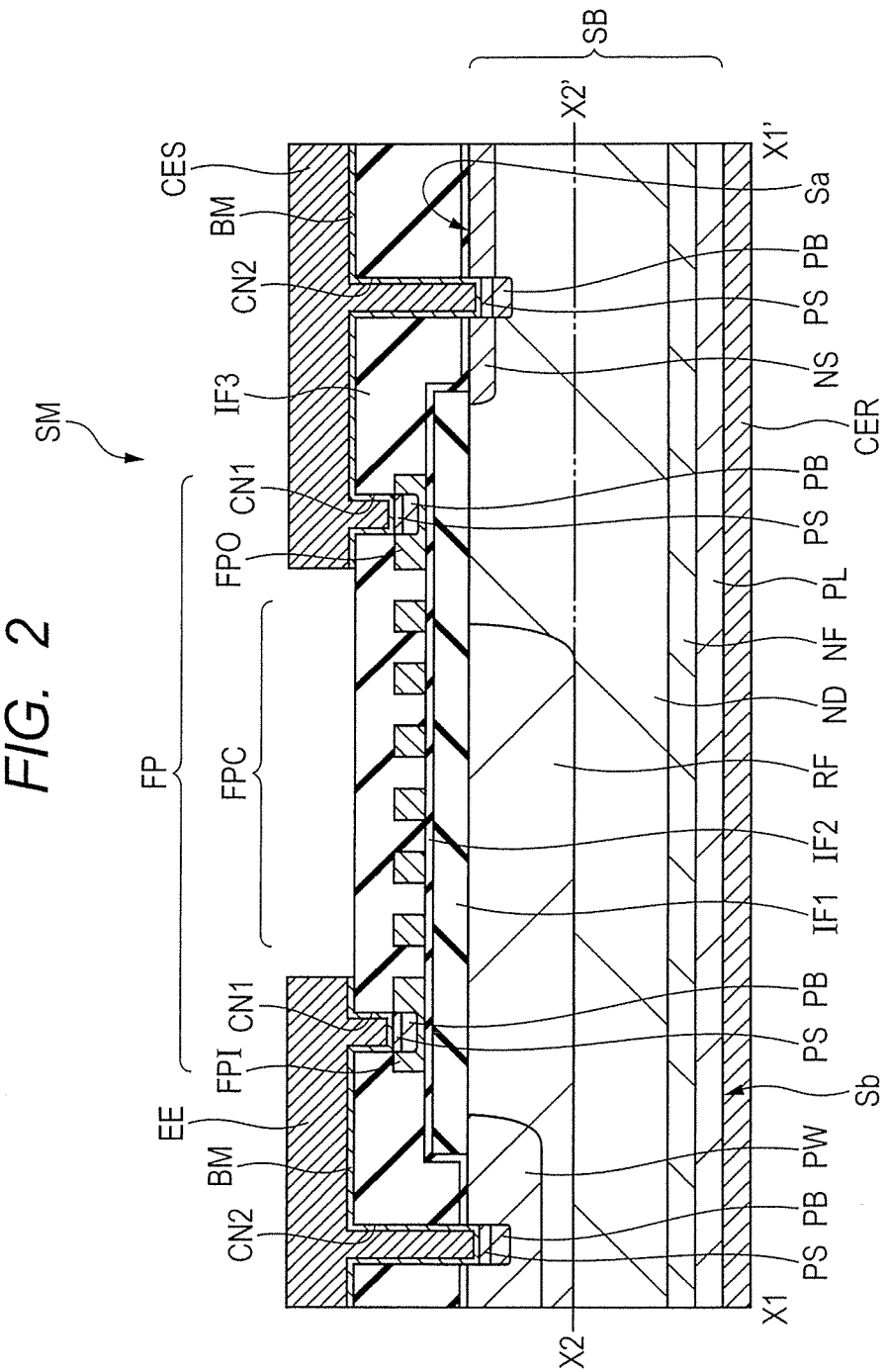
FIG. 2 is a cross-sectional view of the peripheral portion of the semiconductor device of First Embodiment.
Figure 3:
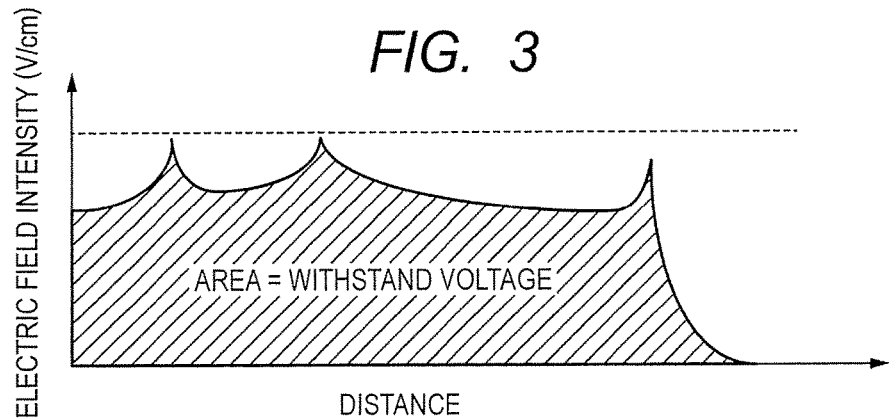
FIG. 3 is a graph describing the advantage of a reduced surface field layer provided in the peripheral portion of the semiconductor device.

Next, the peripheral structure of the semiconductor device according to First Embodiment will be described referring to FIG. 2. FIG. 2 is a cross-sectional view of the peripheral portion of the semiconductor device of First Embodiment and corresponds to the cross-section taken along the line X1-X1' shown in FIG. 1. FIG. 3 is a graph describing the advantage of a reduced surface field layer provided in the peripheral portion of the semiconductor device.

As shown in FIG. 2, a semiconductor substrate SB configuring the semiconductor device SM is made of, for example, single crystal silicon (Si) and has a surface (upper surface, first main surface) Sa and a back surface (lower surface, second main surface) Sb on the side opposite to the surface Sa.

The semiconductor substrate SB has, on the surface Sa side thereof, an emitter electrode EE and a surface collector electrode CES as a surface electrode. The semiconductor substrate SB has, on the back surface Sb side thereof, a back-surface collector electrode CER as a back-surface electrode. The surface collector electrode CES and the back-surface collector electrode CER are electrically coupled to each other by a surface leakage current via a cross-section of the side surface of the semiconductor substrate SM.

The emitter electrode EE is placed at the center portion of the semiconductor device SM in plan view. Although not illustrated in this drawing, it is electrically coupled to an emitter region of an IGBT element or the like. The surface collector electrode CES is placed in the peripheral portion of the semiconductor device SM in plan view and is arranged around the emitter electrode EE, separated from the emitter electrode EE. The back-surface collector electrode CER extends all over the back surface Sb of the semiconductor substrate SB.

The emitter electrode EE, the surface collector electrode CES, and the back-surface collector electrode CER are made of, for example, Al (aluminum), AlSi (aluminum-silicon alloy), AlCu (aluminum-copper alloy), or AlSiCu (aluminum-silicon-copper alloy). In order to suppress generation of Al (aluminum) spikes, AlSi (aluminum-silicon alloy) is preferred.

The semiconductor substrate SB has therein an N$^-$ type layer ND. The N$^-$ type layer ND configures a drift region of the IGBT element and the N$^-$ type layer ND has an impurity concentration of, for example, from about $1 \times 10^{13}$ to about $5 \times 10^{14}$ cm$^{-3}$. The semiconductor substrate SB has, on the back surface Sb side thereof, an N type layer NF. The N type layer NF configures a field stop region of the IGBT element and it has an impurity concentration of, for example, from about $1 \times 10^{15}$ to about $1 \times 10^{18}$ cm$^{-3}$. The semiconductor substrate SB has therein a P type layer PL and it is on the side closer to the back surface Sb than the N type layer NF is. The P type layer PL configures a collector region of the IGBT element and has an impurity concentration of, for example, from about $1 \times 10^{16}$ to $1 \times 10^{20}$ cm$^{-3}$.

The semiconductor substrate SB has, on the surface Sa in the peripheral portion thereof, an insulating film IF1 and the insulating film IF1 is covered with an insulating film IF2. The insulating films IF1 and IF2 are made of, for example, silicon oxide (SiO$_2$). The insulating film IF1 has a thickness of, for example, from about 500 to about 1,000 nm and the insulating film IF2 has a thickness of, for example, about 100 nm.

The insulating films IF1 and IF2 have thereon a resistive field plate FP. The resistive field plate FP is made of, for example, polycrystalline silicon (Si) having a P type impurity introduced therein. It has an inner-circumferential-side resistive field plate FPI, an outer-circumferential-side resistive field plate FPO, and an intermediate resistive field plate FPC.

The inner-circumferential-side resistive field plate FPI encloses the active portion formed at the center of the semiconductor substrate SB and is electrically coupled to the emitter electrode EE. The outer-circumferential-side resistive field plate FPO is placed on a side closer to the outer circumference of the semiconductor substrate SB than the inner-circumferential-side resistive field plate FP1 is, separated from the inner-circumferential-side resistive field plate FP1. It encloses the active portion and is electrically coupled to the surface collector electrode CES. The intermediate resistive field plate FPC is placed between the inner-circumferential-side resistive field plate FPI and the outer-circumferential-side resistive field plate FPO and is coupled to both the inner-circumferential-side resistive field plate FPI and the outer-circumferential-side resistive field plate FPO.

The resistive field plate FP is covered with the insulating film IF3 and the insulating film IF3 has thereon the emitter electrode EE and the surface collector electrode CES having therebelow a barrier metal film BM.

The inner-circumferential-side resistive field plate FPI is electrically coupled to the emitter electrode EE via a coupling hole CN1 formed in the insulating film IF3 and the outer-circumferential-side resistive field plate FPO is electrically coupled to the surface collector electrode CES via a coupling hole CN1 formed in the insulating film IF3.

The inner-circumferential-side resistive field plate FPI and the outer-circumferential-side resistive field plate FPO exposed from the bottom surface of the coupling holes CN1, respectively, have therein a $P^{++}$ type layer PS and it has therebelow a $P^+$ type layer PB in order to reduce coupling resistance. They are formed simultaneously with the formation of a $P^{++}$ type layer PS and a $P^+$ type layer PB in the active portion. The $P^{++}$ type layer PS in the active portion is formed to reduce coupling resistance and the $P^+$ type layer PB in the active portion is formed to reduce the base resistance of the active portion in order to suppress an increase in the base potential generated during discharge of carriers (holes) and thereby prevent parasitic PNP operation.

The semiconductor substrate SB just below the resistive field plate FP has, in the surface Sa, a P type reduced surface field layer RF.

FIG. 3 is a graph showing an electric field distribution of the bottom surface of the P type reduced surface field layer RF (surface taken along the line X2-X2' of FIG. 2). It is apparent from FIG. 3 that due to the P type reduced surface field layer RF thus formed, the electric field of the surface Sa of the semiconductor substrate SB is reduced, leading to improvement in breakdown voltage. The P type reduced surface field layer RF has an impurity concentration of, for example, from about $1 \times 10^{15}$ to about $1 \times 10^{17}$ $cm^{-3}$.

The P type reduced surface field layer RF is present not only just below the resistive field plate FP but also, in a region not overlapping, in plan view, with the resistive field plate FP for electrical coupling to the emitter electrode EE.

A P type well layer PW is embraced in the P type reduced surface field layer RF in a region not overlapping, in plan view, with the resistive field plate FP (an inside region of the peripheral portion). The P type well layer PW has an impurity concentration higher than that of the P type reduced surface field layer RF and is, for example, from about $1 \times 10^{17}$ to about $1 \times 10^{19}$ $cm^{-3}$. The P type well layer PW is electrically coupled to the emitter electrode EE via a coupling hole CN2 formed in the insulating films IF2 and IF3. Therefore, the inner-circumferential-side resistive field plate FPI is electrically coupled to the P type reduced surface field layer RF via the emitter electrode EE and the P type well layer PW.

The P type well layer PW exposed from the bottom surface of the coupling hole CN2 has therein a $P^{++}$ type layer PS and it has therebelow a $P^+$ type layer PB. They contribute to a reduction in coupling resistance. They are formed, as described above, simultaneously with the formation of the $P^{++}$ type layer PS and the $P^+$ type layer PB in the active region.

An $N^+$ type layer NS is present in a region (outside region of the peripheral portion) not overlapping, in plan view, with the resistive field plate FP. The $N^+$ type layer NS has an impurity concentration higher than that of the $N^-$ type layer ND and is, for example, from about $1 \times 10^{19}$ to about $1 \times 10^{21}$ $cm^{-3}$. It has a function of stopping a depletion layer extending from the active portion and preventing the depletion layer, which will otherwise reach the end portion of the semiconductor substrate SB, from deteriorating the withstand voltage. The $N^+$ type layer NS is electrically coupled to the surface collector electrode CES via a coupling hole CN2 formed in the insulating films IF2 and IF3. Therefore, the outer-circumferential-side resistive field plate FPO is electrically coupled to the $N^-$ type layer ND via the surface collector electrode CES and the $N^+$ type layer NS.

The $N^+$ type layer NS exposed from the bottom surface of the coupling hole CN2 has therein a $P^{++}$ type layer PS and it has therebelow a $P^+$ type layer PB. As described above, there are formed simultaneously with the formation of the $P^{++}$ type layer PS and the $P^+$ type layer PB in the active portion.

<Manufacturing Method of Semiconductor Device>

A manufacturing method of the semiconductor device according to First Embodiment will be described in order of steps referring to FIGS. 4 to 15. FIGS. 4A to 15A and FIGS. 4B to 15B are cross-sectional views of an active portion in which an IGBT element is to be formed and cross-sectional views of a peripheral portion in which a resistive field plate is to be formed, respectively, according to First Embodiment.

Figure 4A:
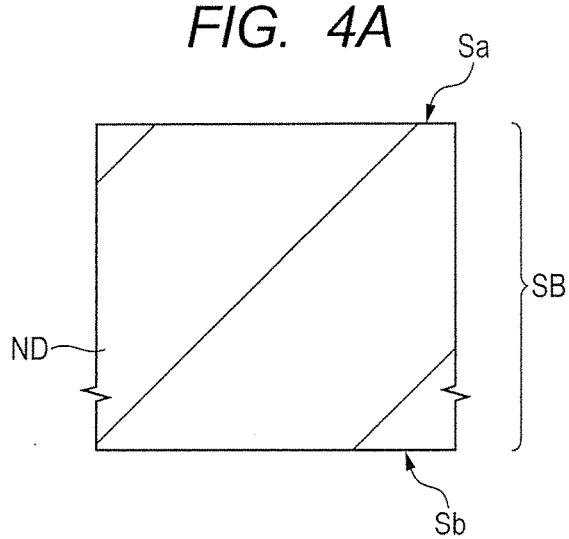
FIG. 4A and FIG. 4B are cross-sectional views showing the semiconductor device (IGBT element and resistive field plate) of First Embodiment during a manufacturing step thereof.
Figure 4B:
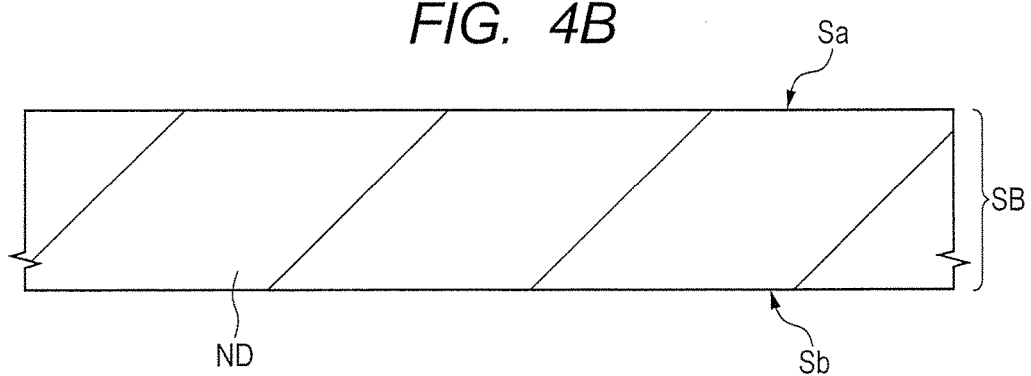

First, as shown in FIGS. 4A and 4B, a semiconductor substrate (in this stage, a semiconductor thin plate having a substantially circular plane called "semiconductor wafer") having a surface Sa and a back surface Sb opposite to the surface Sa is provided. The semiconductor substrate SB is made of, for example, single crystal silicon (Si) and is formed, for example, by CZ (Czochralski method), MCZ (magnetic field applied Czochralski method), FZ (floating zone method), or epitaxial growth method. The semiconductor substrate SB has, on the entire surface thereof, an $N^-$ type layer ND (drift region). The $N^-$ type layer ND has an impurity concentration of, for example, from about $1 \times 10^{13}$ to about $5 \times 10^{14}$ $cm^{-3}$.

Figure 5A:
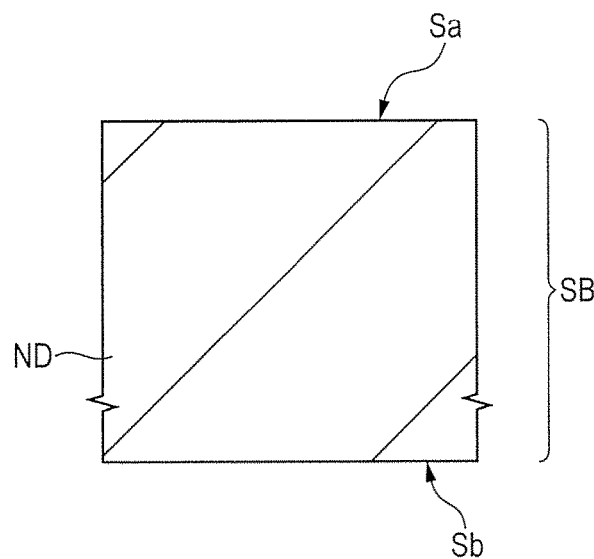
FIG. 5A and FIG. 5B are cross-sectional views showing the semiconductor device during a manufacturing step following that of FIG. 4A and FIG. 4B.
Figure 5B:
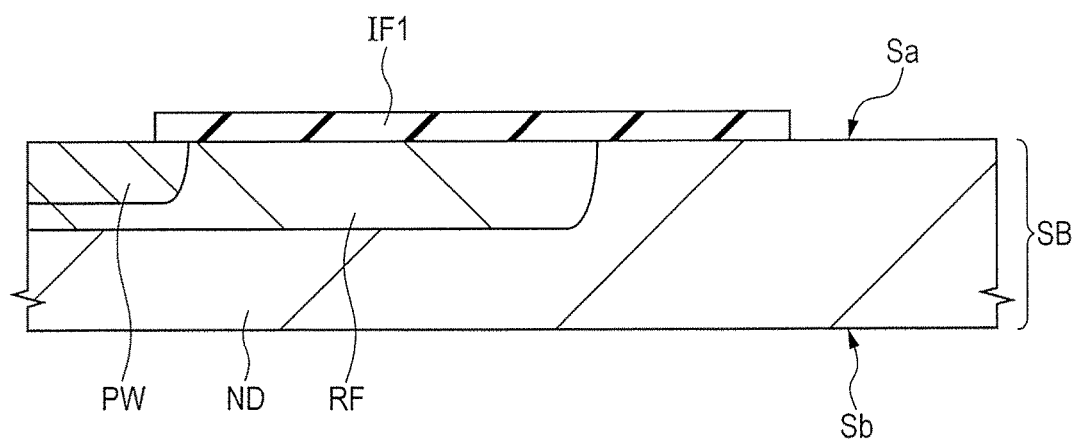

Next, as shown in FIGS. 5A and 5B, an insulating film IF1 is formed on the surface Sa in the peripheral portion of the semiconductor substrate SB. The insulating film IF1 is made of, for example, silicon oxide ($SiO_2$) and has a thickness of, for example, from about 500 to about 1,000 nm.

Next, a P type reduced surface field layer RF having a predetermined depth from the surface Sa of the semiconductor substrate SB is formed by ion implantation of a P type impurity, for example, boron (B) into the surface Sa of the peripheral portion of the semiconductor substrate SB. The P type reduced surface field layer RF is formed, via the insulating film IF1, in the semiconductor substrate SB just below a resistive field plate FP to be formed in a later step. In other words, the P type reduced surface field layer RF is formed, in contact with the insulating film IF1, in the semiconductor substrate SB just below a resistive field plate FP. The P type reduced surface field layer RF has an impurity concentration of, for example, from about $1 \times 10^{15}$ to about $1 \times 10^{17}$ $cm^{-3}$.

Next, a p type well layer PW having a predetermined depth from the surface Sa of the semiconductor substrate SB is formed in the P type reduced surface field layer RF on the inner circumferential side of the peripheral portion by ion implantation of a P type impurity, for example, boron (B) into the surface Sa of the peripheral portion of the semiconductor substrate SB. The P type well layer PW is formed in a region to which an emitter electrode EE to be formed in a later step is coupled and the P type well layer PW has a depth less than that of the P type reduced surface field layer RF. The P type well layer PW has an impurity concentration higher than that of the P type reduced surface field layer RF and is, for example, from about $1\times10^{17}$ to about $1\times10^{19}$ cm$^{-3}$.

Figure 6A:
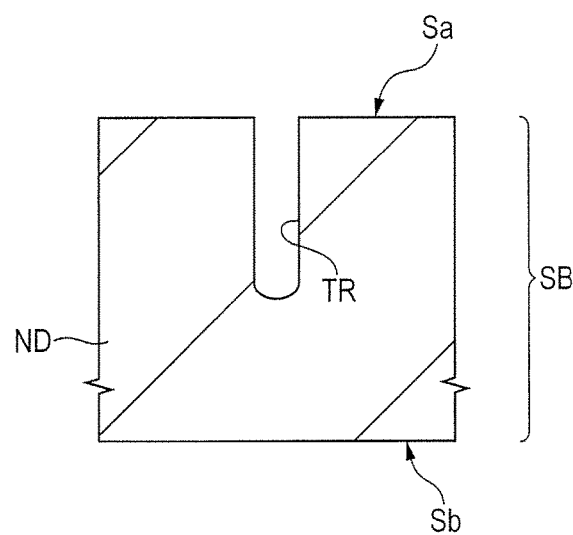
FIGS. 6A and 6B are cross-sectional views showing the semiconductor device during a manufacturing step following that of FIG. 5A and FIG. 5B.
Figure 6B:
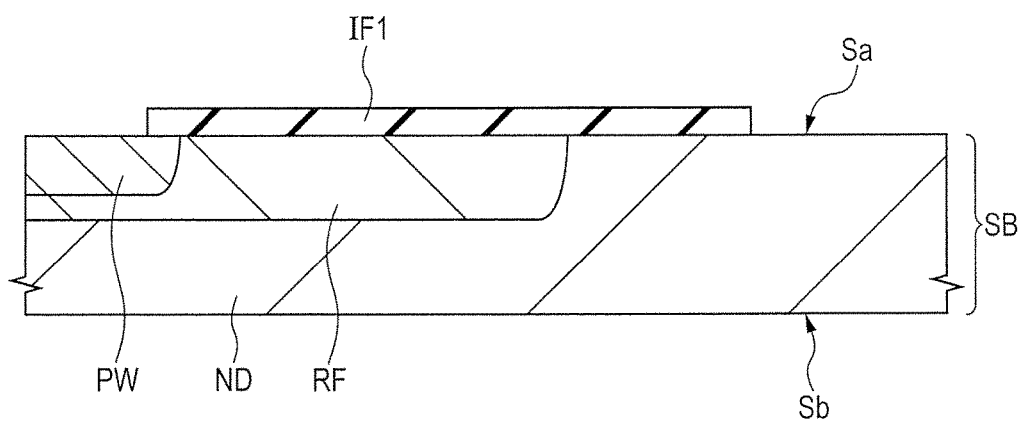

Next, as shown in FIGS. 6A and 6B, a trench TR having a predetermined depth is formed on the side of the surface Sa of the semiconductor substrate SB in the active portion. The trench TR has a depth of, for example, from about 2 to about 10 μm.

Figure 7A:
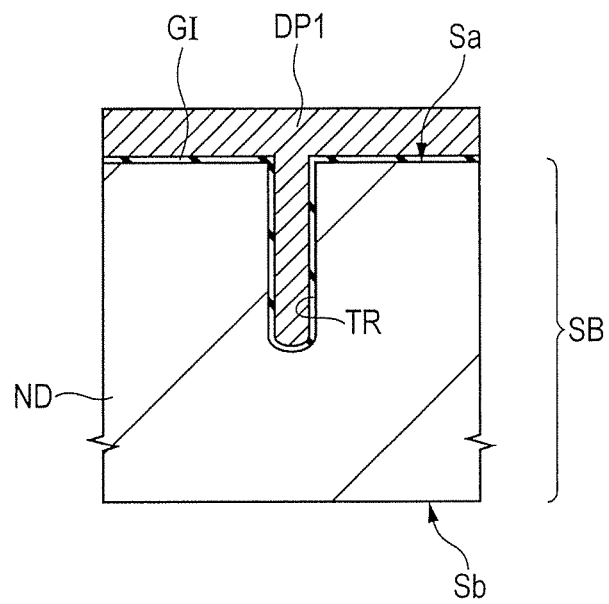
FIG. 7A and FIG. 7B are cross-sectional views showing the semiconductor device during a manufacturing step following that of FIG. 6A and FIG. 6B.
Figure 7B:
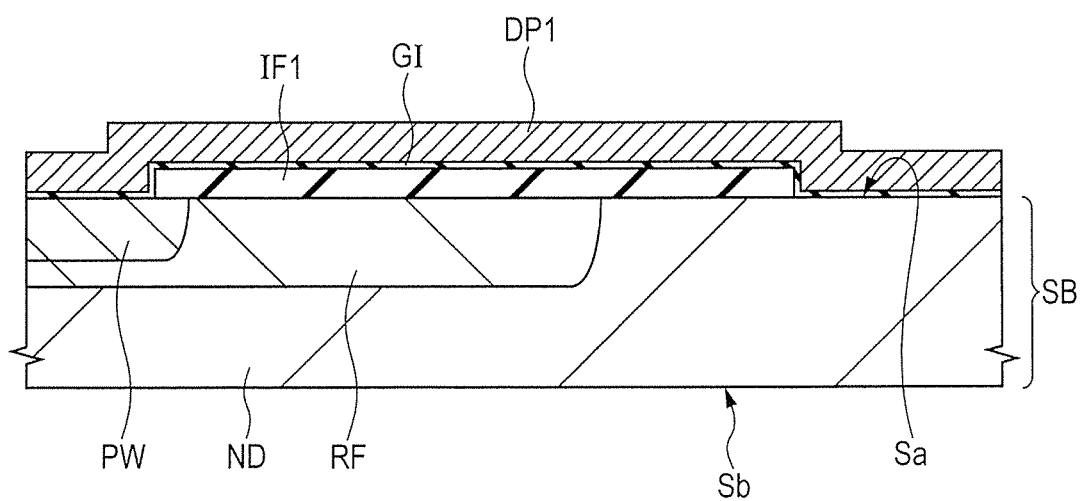

Next, as shown in FIGS. 7A and 7B, a gate insulating film GI is formed on the side of the surface Sa of the semiconductor substrate SB including the inner wall (side surface and bottom surface) of the trench TR. The gate insulating film GI is made of, for example, silicon oxide ($SiO_2$). The gate insulating film GI has a thickness of, for example, from about 50 to about 150 nm.

Next, a polycrystalline silicon film DP1 is formed on the gate insulating film GI so as to fill the trench TR. The polycrystalline silicon film DP1 has a thickness of, for example, from about 500 to about 700 nm.

Figure 8A:
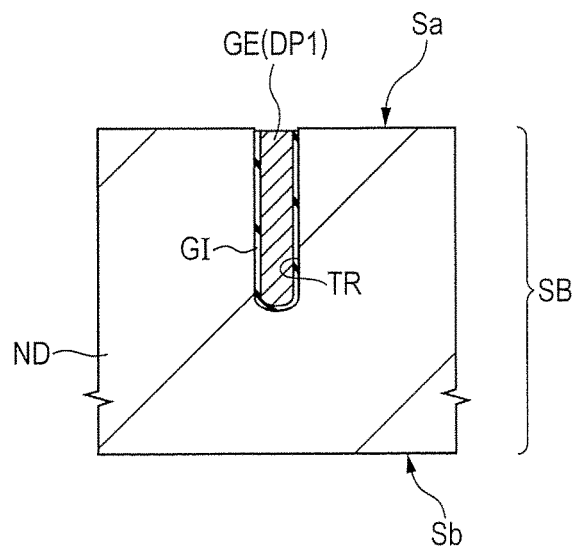
FIG. 8A and FIG. 8B are cross-sectional views showing the semiconductor device during a manufacturing step following that of FIG. 7A and FIG. 7B.
Figure 8B:
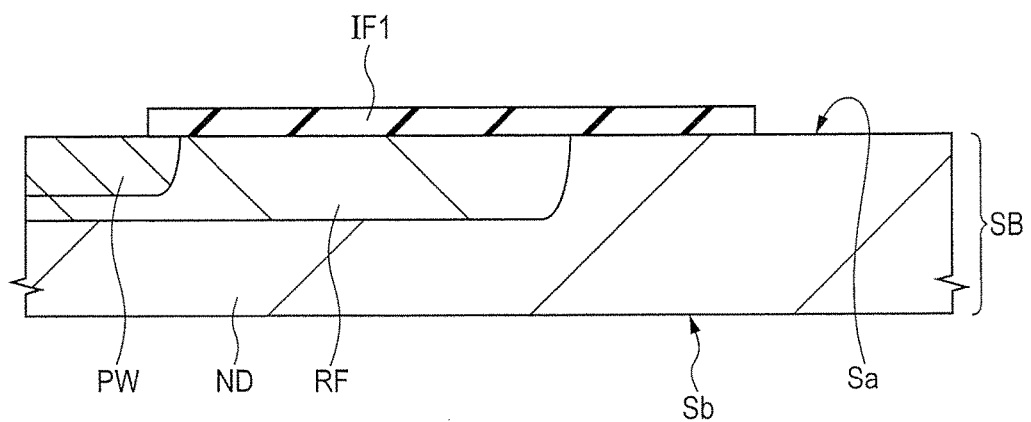

Next, as shown in FIGS. 8A and 8B, a gate electrode GE made of the polycrystalline silicon film DP1 is formed by etching back the polycrystalline silicon film DP1 and the gate insulating film GI and thereby filling the trench TR with the polycrystalline silicon film DPI via the gate insulating film GI.

Figure 9A:
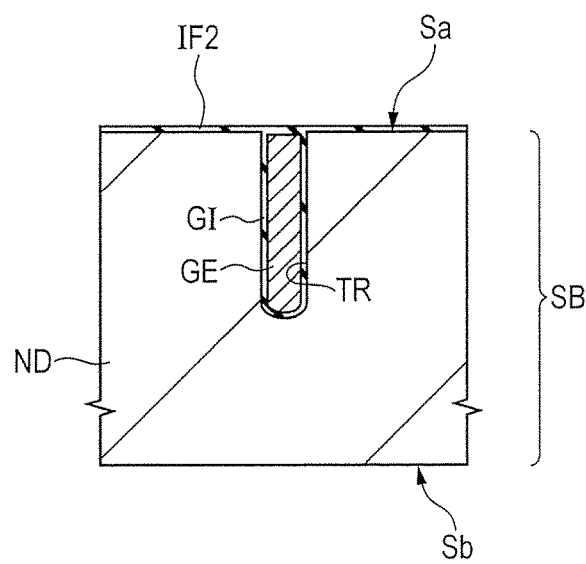
FIG. 9 is a FIG. 9A and FIG. 9B are cross-sectional views showing the semiconductor device during a manufacturing step following that of FIG. 8A and FIG. 8B.
Figure 9B:
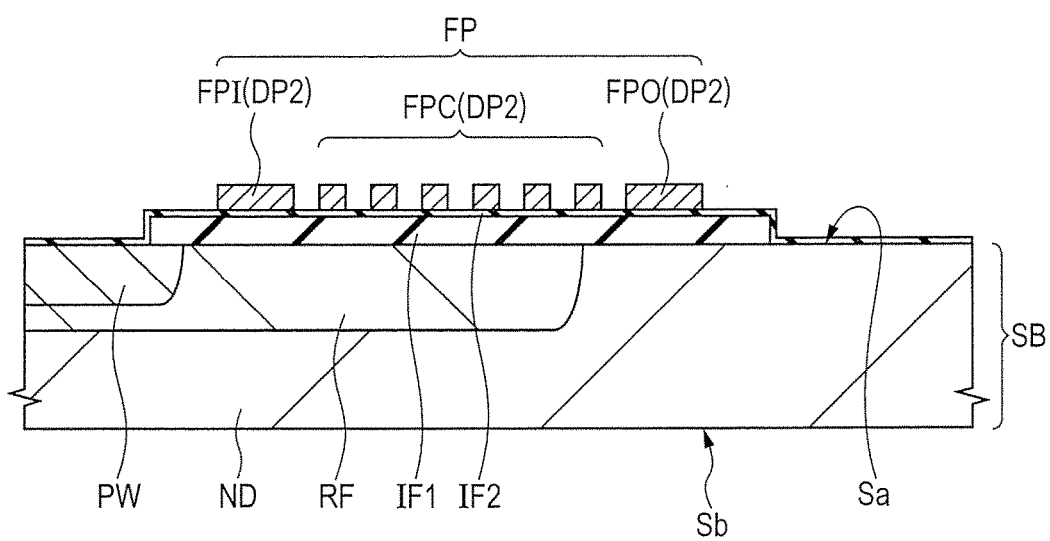

Next, as shown in FIGS. 9A and 9B, an insulating film IF2 is formed on the side of the surface Sa of the semiconductor substrate SB. The insulating film IF2 is made of, for example, silicon oxide ($SiO_2$) and has a thickness of, for example, about 100 nm.

Next, a polycrystalline silicon film DP2 is formed on the insulating film IF2. The polycrystalline silicon film DP2 has a P type impurity, for example, boron (B) introduced therein and it has a thickness of, for example, from about 500 to about 700 nm. The impurity concentration of the polycrystalline silicon film DP2 is adjusted so as to attain a desired withstand voltage leakage current. Then, by dry etching with a resist pattern as a mask, the polycrystalline silicon film DP2 is processed into a resistive field plate FP (an inner-circumferential-side resistive field plate FPI, an outer-circumferential-side resistive field plate FPO and an intermediate resistive field plate FPC).

Figure 10A:
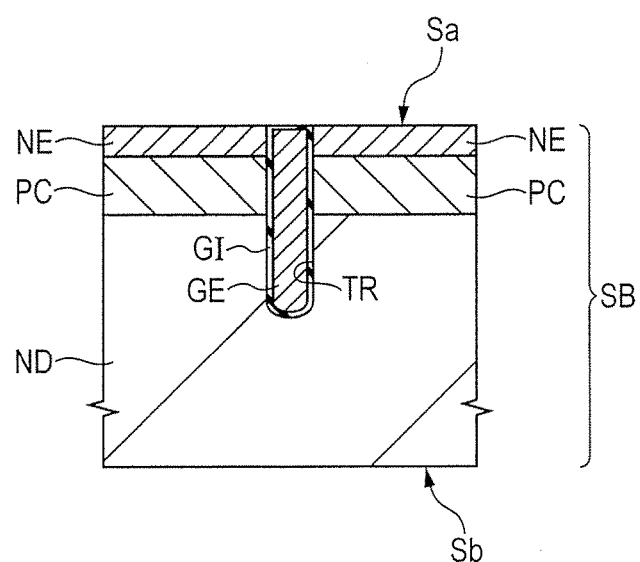
FIGS. 10A and 10b are cross-sectional views showing the semiconductor device during a manufacturing step following that of FIG. 9A and FIG. 9B.
Figure 10B:
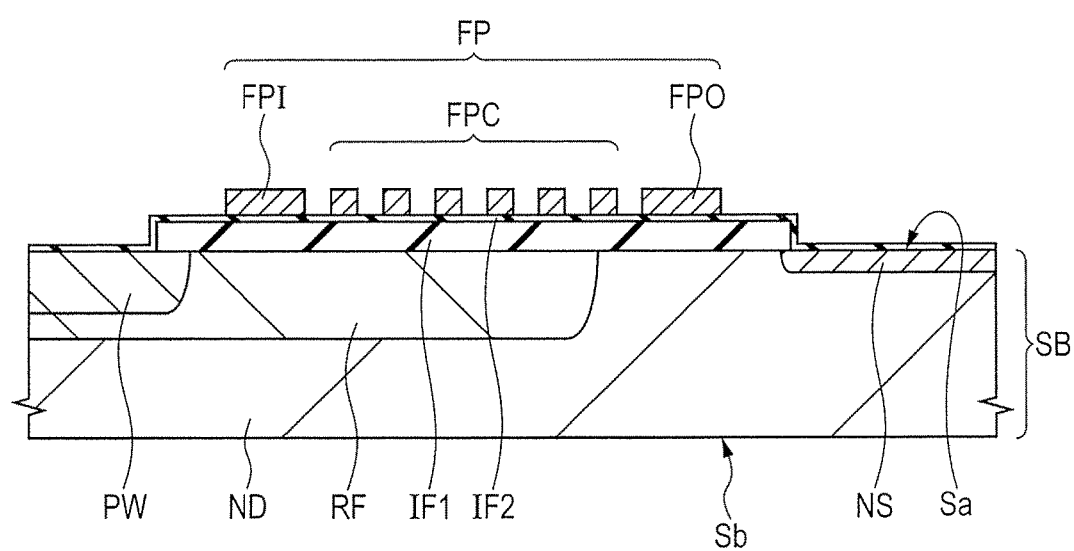

Next, as shown in FIGS. 10A and 10B, a p type layer PC (a portion of a body region) having a predetermined depth from the surface Sa of the semiconductor substrate SB is formed by ion implantation of a P type impurity into the surface Sa of the semiconductor substrate SB of the active portion. The P type layer PC has a depth less than that of the trench TR.

Next, an N type impurity is ion-implanted into the surface Sa of the semiconductor substrate SB in the active portion and the peripheral portion to form an $N^+$ type layer NE (emitter region) in the active region and an $N^+$ type layer NS (source region) on the outer circumferential side in the peripheral portion, each having a predetermined depth from the surface Sa of the semiconductor substrate SB and having a depth less than that of the P type layer PC. The $N^+$ type layers NE and NS have an impurity concentration of, for example, about $1\times10^{19}$ to about $1\times10^{21}$ cm$^{-3}$ and the $N^+$ type layers NE and NS have a depth less than that of the trench TR.

Figure 11A:
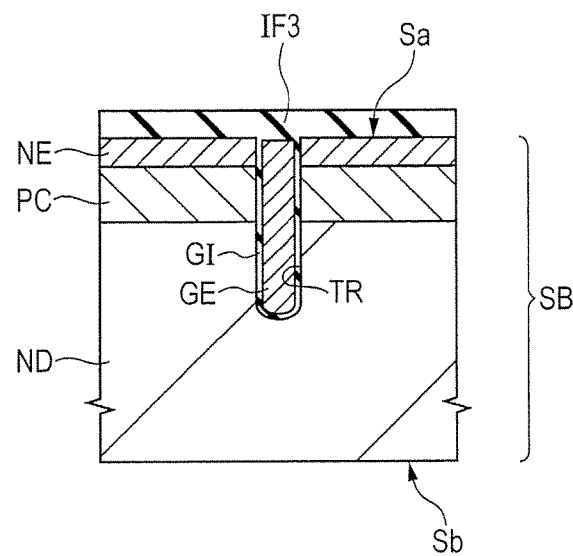
FIG. 11A and FIG. 11B are cross-sectional views showing the semiconductor device during a manufacturing step following that of FIG. 10A and FIG. 10B.
Figure 11B:
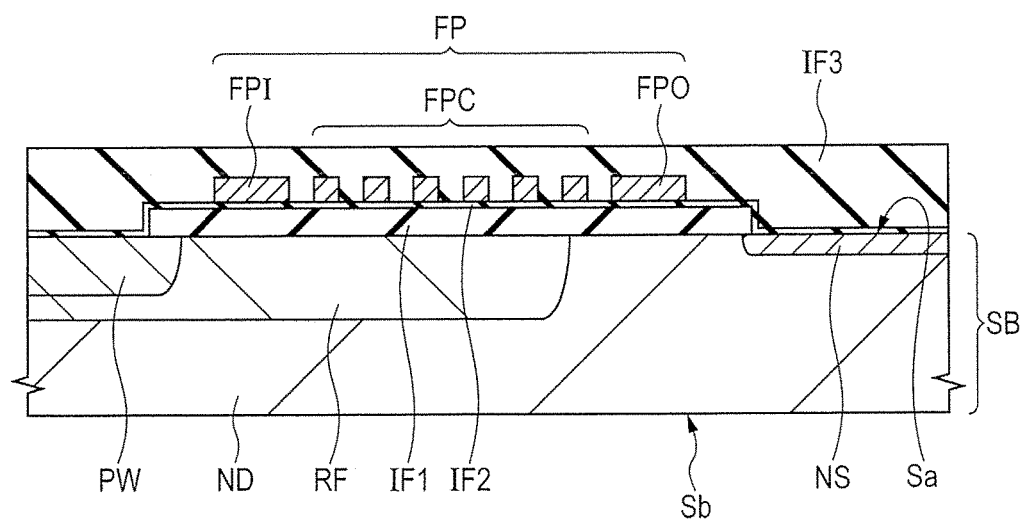

Next, as shown in FIGS. 11A and 11B, an insulating film IF3 is formed on the side of the surface Sa of the semiconductor substrate SB so as to cover the resistive field plate FP. The insulating film IF3 is made of, for example, silicon oxide ($SiO_2$).

Figure 12A:
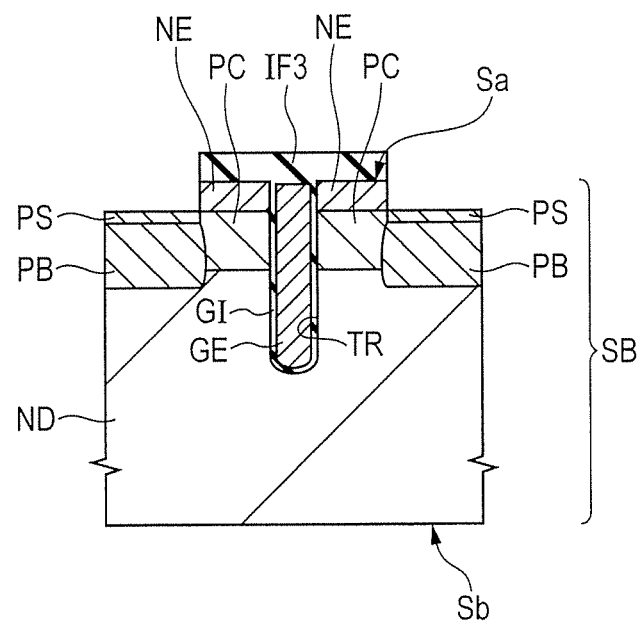
FIG. 12A and FIG. 12B are cross-sectional views showing the semiconductor device during a manufacturing step following that of FIG. 11A and FIG. 11B.
Figure 12B:
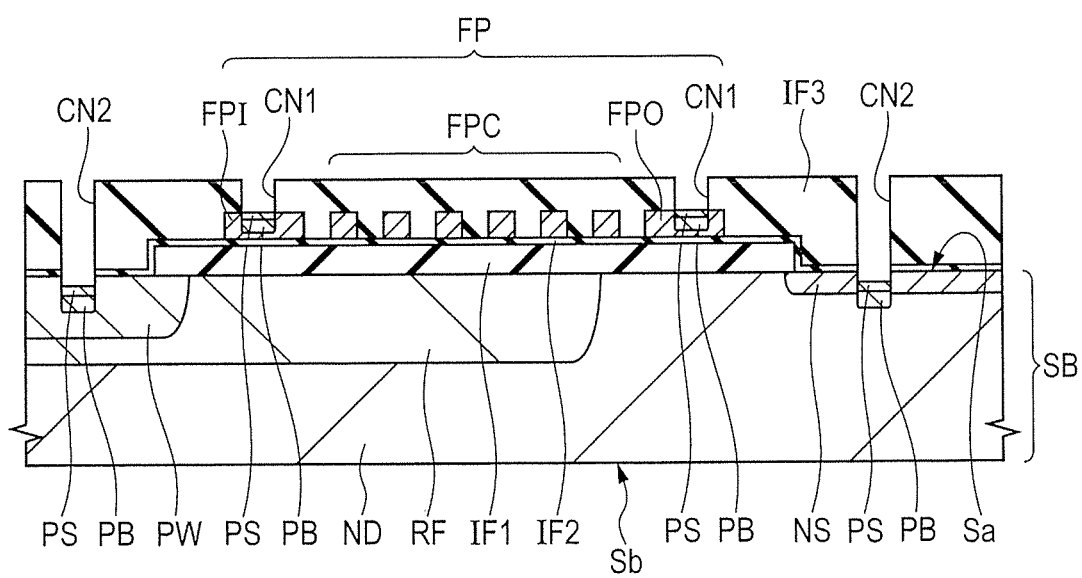

Next, as shown in FIGS. 12A and 12B, coupling holes CN1 and CN2 are formed by etching and removing, in the active portion, the insulating film IF3 from a region to which a surface electrode (emitter electrode EE) to be formed in a later step is coupled and etching and removing, in the peripheral portion, the insulating films IF2 and IF3 from a region to which surface electrodes (emitter electrode EE and surface collector electrode CES) to be formed in a later step are coupled. Further, in the active portion, the semiconductor substrate SB is removed by etching until exposure of the P type layer PC.

As a result, in the active portion, a portion of each of the P type layer PC and the $N^+$ layer NE is exposed in a region to which the surface electrode is coupled. In the peripheral portion, on the other hand, a portion of the inner-circumferential-side resistive field plate FPI or the outer-circumferential-side resistive field plate FPO is exposed from the bottom surface of the coupling hole CN1 and a portion of the P type well layer PW or the $N^+$ type layer NS is exposed from the bottom surface of the coupling hole CN2.

Next, a $P^+$ type layer PB (another portion of the body region) is formed by ion implantation of a p type impurity into the P type layer PC (surface Sa of the semiconductor substrate SB) exposed in the active portion. The $P^+$ type layer PB has a depth equal to or greater than the depth of the P type layer PC and a depth less than that of the trench TR. Further, a P type impurity is ion-implanted into the upper portion of the $P^+$ type layer PB to form a $P^{++}$ type layer PS having an impurity concentration higher than that of the $P^+$ type layer PB.

Simultaneously with the formation of a $P^+$ type layer PB and a $P^{++}$ type layer PS in the active portion, a $P^+$ type layer PB and a $P^{++}$ type layer PS are formed in the inner-circumferential-side resistive field plate FPI and the outer-circumferential-side resistive field plate FPO exposed from the bottom surface of the connecting hole CN1 and in the P type well layer PW and the $N^+$ type layer NS exposed from the bottom surface of the connecting hole CN2, in the peripheral portion.

Figure 13A:
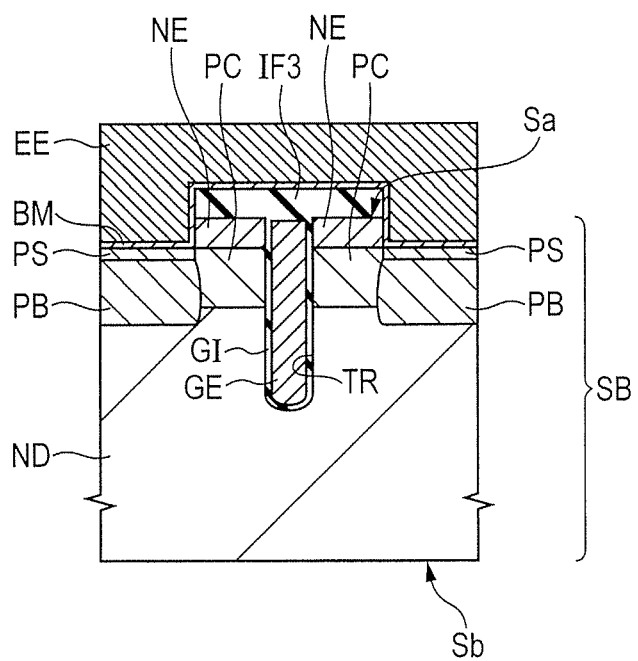
FIG. 13A and FIG. 13B are cross-sectional views showing the semiconductor device during a manufacturing step following that of FIG. 12A and FIG. 12B.
Figure 13B:
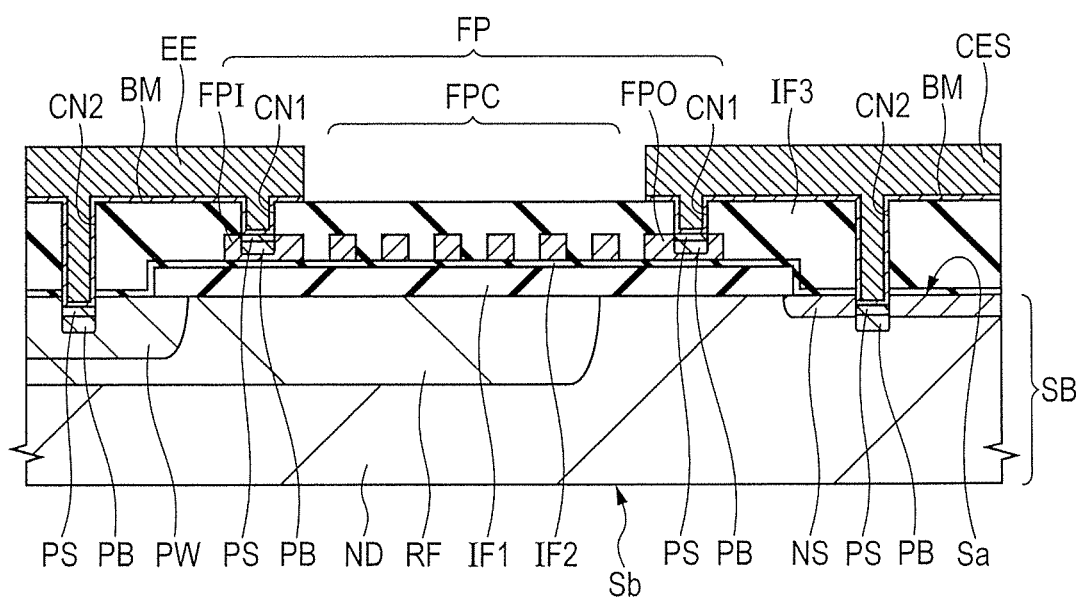

Next, as shown in FIGS. 13A and 13B, a barrier metal film BM is formed so as to cover, in the active portion, the $P^{++}$ type layer PS, the $N^+$ type layer NE, and the insulating film IF3 and cover, in the peripheral portion, the insulating film IF3 while being in contact with the P type well layer PW, the $N^+$ type layer NS, the inner-circumferential-side resistive field plate FPI, and the outer-circumferential-side resistive field plate FPO, each exposed from the bottom surface of the coupling hole CN1 or CN2. Then, an emitter electrode EE and a surface collector electrode CES are formed by depositing a conductive film on the barrier metal film BM and processing the resulting conductive film.

The barrier metal film BM is made of, for example, TiW (titanium-tungsten). The emitter electrode EE and the surface collector electrode CES are made of, for example, Al (aluminum), AlSi (aluminum-silicon alloy), AlCu (aluminum-copper alloy), or AlSiCu (aluminum-silicon-copper alloy). Of there, AlSi (aluminum-silicon alloy) is preferred in order to suppress generation of Al (aluminum) spikes.

The the emitter electrode EE is electrically coupled to the $P^{++}$ type layer PS and the $N^+$ type layer NE in the active portion and electrically coupled to the P type well layer PW and the inner-circumferential-side resistive field plate FPI in the peripheral portion. The surface collector electrode CES is electrically coupled to the outer-circumferential-side resistive field plate FPO and the N+ type layer NS.

Figure 14A:
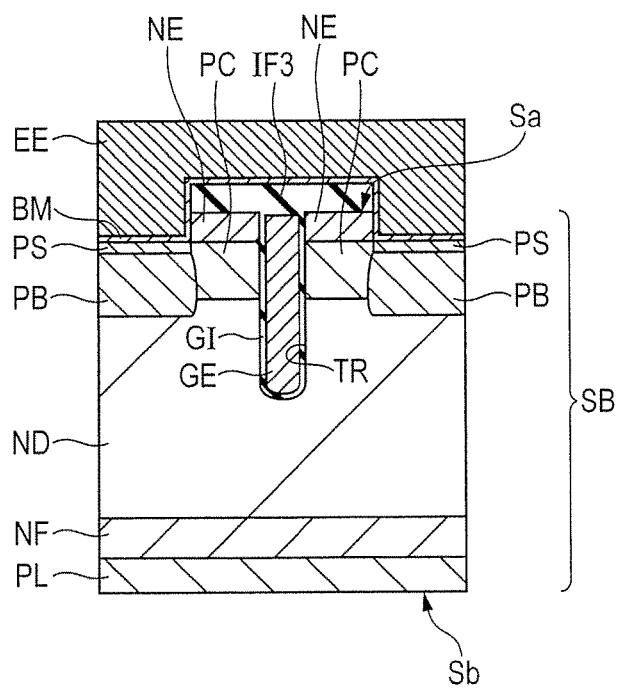
FIG. 14A and FIG. 14B are cross-sectional views showing the semiconductor device during a manufacturing step following that of FIG. 13A and FIG. 13B.
Figure 14B:
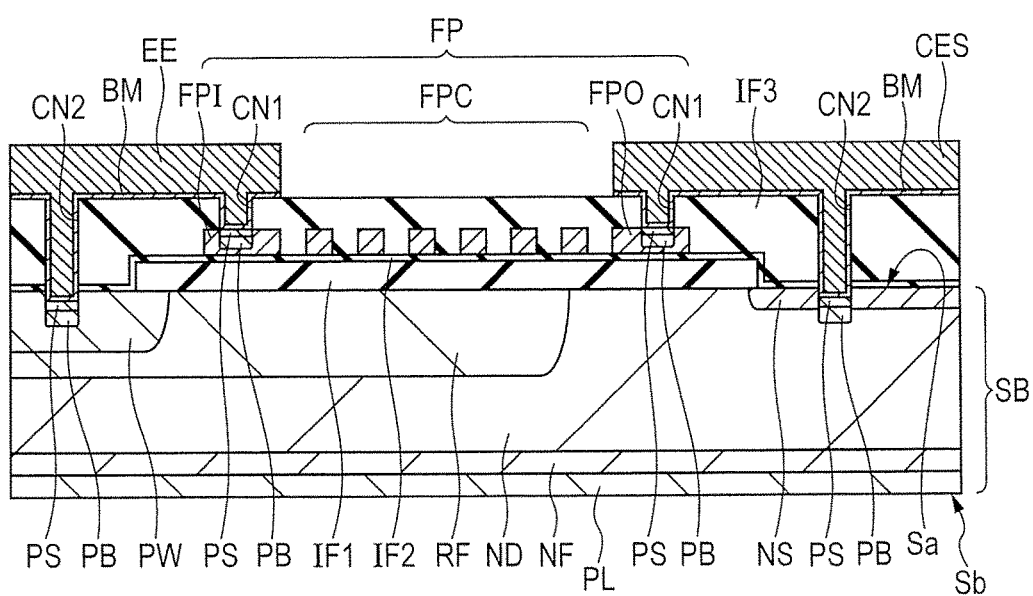

Next, as shown in FIGS. 14A and 14B, the back surface Sb of the semiconductor substrate SB is polished to thin the semiconductor substrate SB to a predetermined thickness. The semiconductor substrate SB has a thickness of, for example, from about 40 to 200 μm. Then, a crushed layer is removed from the back surface Sb of the semiconductor substrate SB by spin etching using, for example, a mixed acid (containing hydrofluoric acid, nitric acid, sulfuric acid, or the like).

An N type layer NF (field stop region) having a predetermined depth from the back surface Sb of the semiconductor substrate SB is formed by ion implantation of an N type impurity, for example, phosphorus (P) into the entire back surface Sb of the semiconductor substrate SB. The N type layer NF has an impurity concentration of, for example, from about $1\times10^{15}$ to $1\times10^{18}$ cm$^{-3}$. Then, a P type layer PL (collector region) is formed in a region having a predetermined depth from the back surface Sb of the semiconductor substrate SB and having a depth less than that of the N type layer NF by ion implantation of a P type impurity, for example, boron (B) into the entire back surface Sb of the semiconductor substrate SB. The P type layer PL has an impurity concentration of, for example, from about $1\times10^{16}$ to $1\times10^{20}$ cm$^{-3}$.

Next, the semiconductor substrate SB is subjected to laser annealing treatment to activate the impurities introduced into the semiconductor substrate SB.

Figure 15A:
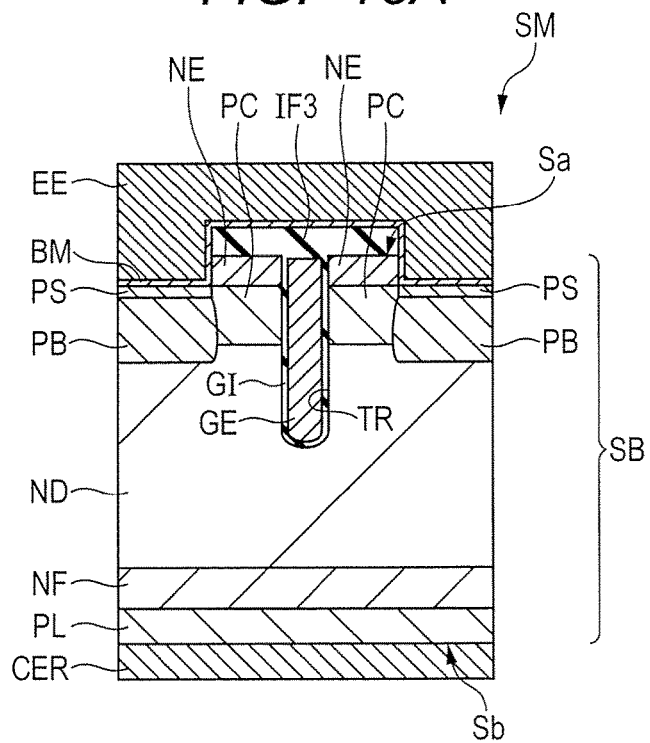
FIG. 15A and FIG. 15B are cross-sectional views showing the semiconductor device during a manufacturing step following that of FIG. 14A and FIG. 14B.
Figure 15B:
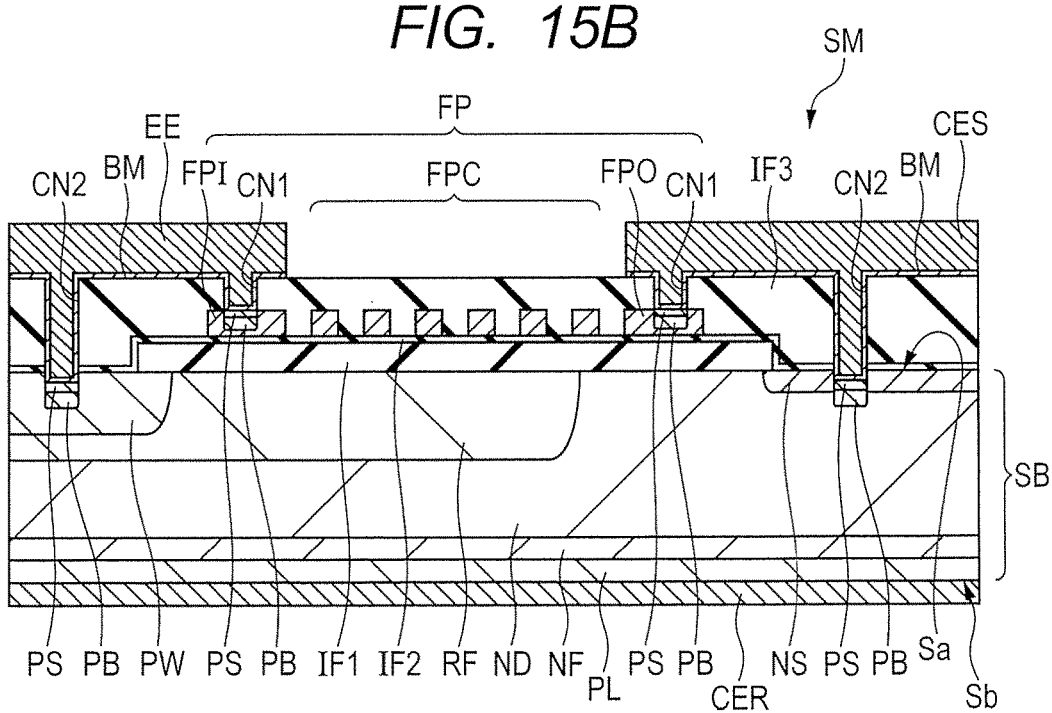

Next, as shown in FIGS. 15A and 15B, a back-surface collector electrode CER is formed on the back surface Sb of the semiconductor substrate SB. The back-surface collector electrode CER is made of, for example, Al (aluminum), AlSi (aluminum-silicon alloy), or the like. Of these, AlSi (aluminum-silicon alloy) is preferred in order to suppress generation of Al (aluminum) spikes.

Then, the semiconductor substrate SB is cut along a predetermined scribe line into individual semiconductor devices (semiconductor chips).

By the above-described manufacturing steps, the semiconductor device SM equipped with the IGBT element is substantially completed.

According to First Embodiment, the plurality of second intermediate resistive field plates FPC2 located in the corner portions B1, B2, B3, and B4, respectively, have a potential equal to that of the first portions of the first intermediate resistive field plate FPC1 coupled to the second intermediate resistive field plates FPC2. This makes it possible to make uniform the electric field distribution among the orbits also in the corner portions B1, B2, B3, and B4.

The electric field distribution of the resistive field plate FP therefore becomes uniform among the orbits and the resulting semiconductor device SM can have an improved breakdown voltage. In thermal equilibrium, no electric current flows through the plurality of second intermediate resistive field plates FPC2 formed in the corner portions B1, B2, B3, and B4. The impurity concentration of polycrystalline silicon (Si) configuring the resistive field plate FP can therefore be adjusted as an independent parameter so that a reduction in withstand voltage leakage current can be achieved. As a result, the semiconductor device SM thus obtained can have an improved breakdown voltage and in addition, have a reduced withstand voltage leakage current.

<First Modification Example>

The resistive field plate of this example is different from the resistive field plate FP shown in FIG. 1 in planar layout of an intermediate resistive field plate.

Figure 16:
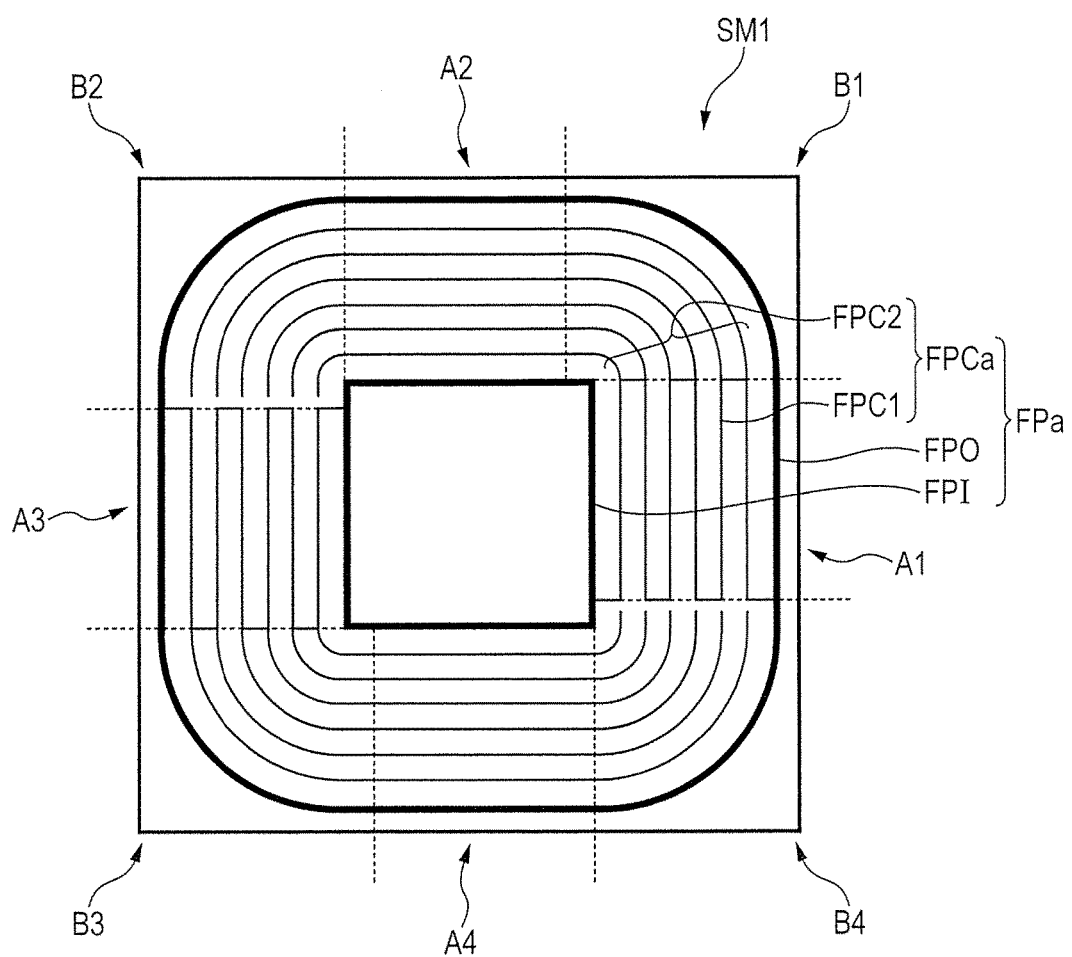
FIG. 16 is a plan view showing a resistive field plate formed in the peripheral portion of a semiconductor device of First Modification Example of First Embodiment.

The planar layout of the resistive field plate according to First Modification Example of First Embodiment will hereinafter be described referring to FIG. 16. FIG. 16 is a plan view showing the resistive field plate formed in the peripheral portion of a semiconductor device of First Modification Example of First Embodiment.

In the resistive field plate FP shown in FIG. 1, four intermediate resistive field plates FPC comprised of four first intermediate resistive field plates FPC1 and a plurality of second intermediate resistive field plates FPC2 connected with each of them are coupled in parallel between an inner-circumferential-side resistive field plate FPI and an outer-circumferential-side resistive field plate FPO.

In First Modification Example, in contrast, two intermediate resistive field plates FPCa comprised of two first intermediate resistive field plates FPC1 and a plurality of second intermediate resistive field plates FPC2 connected therewith, respectively, are coupled in parallel between an inner-circumferential-side resistive field plate FPI and an outer-circumferential-side resistive field plate FPO.

The intermediate resistive field plate FPCa of the resistive field plate FPa formed in the peripheral portion of a semiconductor device SM1 has, in two linear portions A1 and A3 opposite to each other, first intermediate resistive field plates FPC1, respectively.

The second intermediate resist field plates FPC2 are each connected with one end portion of six first portions of the first intermediate resistive field plate FPC1 located in the linear portion A1 and extend in one direction like a branch. These second intermediate resistive field plates FPC2 extend to a corner portion B1, a linear portion A2, and a corner portion B2. It has a linear shape in the linear portion A2, while it has a curvature in the corner portion B1 and the corner portion B2. The plurality of second intermediate resistive field plates FPC2 is, in contrast, opened at the other end portion (tip portion).

Second intermediate resist field plates FPC2 are each connected with one end portion of each of six first portions of the first intermediate resistive field plate FPC1 located in the linear portion A3 and extend in one direction like a branch. These second intermediate resistive field plates FPC2 extend to a corner portion B3, a linear portion A4, and a corner portion B4. It has a linear shape in the linear portion A4, while it has a curvature in the corner portion B3 and the corner portion B4. The plurality of second intermediate resistive field plates FPC2 is, in contrast, opened at the other end portion (tip portion).

The plurality of second intermediate resistive field plates FPC2 has a fixed width equal to the width of the first intermediate resistive field plate FPC1. The plurality of second intermediate resistive field plates FPC2 has a pitch equal to that of the plurality of first portions of the first intermediate resistive field plate FPC1.

In the resistive field plate FPa of First Modification Example similar to the above-described resistive field plate FP, the plurality of second intermediate resistive field plates FPC2 is not directly connected with the the inner-circumferential-side resistive field plate FPI or the outer-circumferential-side resistive field plate FPO. In thermal equilibrium, therefore, an electric current flows only through the first intermediate resistive field plate FPC1 and does not flow through the second intermediate resistive field plates FPC2. Therefore, it is free from the influence of a difference in resistance caused by a difference in curvature radius.

Further, the plurality of second intermediate resistive field plates FPC2 can make use of a potential of the first portions of the first intermediate resistive field plate FPC1 with which the plurality of second intermediate resistive field plates FPC2 is connected, respectively. The potential of the second intermediate resistive field plates FPC2 becomes equal to that of the first portions of the first intermediate resistive field plate FPC1 with which the second intermediate resistive field plates FPC2 are connected so that the electric field distribution can be made uniform among the orbits even in the corner portions B1, B2, B3, and B4.

In the resistive field plate FPa, the electric field distribution among the orbits is made uniform and the semiconductor device SM1 can be prevented from having a reduced breakdown voltage.

Further, the opened tip portion of the plurality of second intermediate resistive field plates FPC2 has a linear shape.

Since the plurality of second intermediate resistive field plates FPC2 has a linear opened tip portion, the risk of reduction in breakdown voltage due to the planar layout, shape, or manufacturing process of the resistive field plate FPa can be suppressed to the minimum, which is almost the same as that of the above-described resistive field plate FP.

The semiconductor device SM1 equipped with the resistive field plate FPa of First Modification Example can therefore have an improved breakdown voltage and at the same time, a reduced withstand voltage leakage current.

<Second Modification Example>

The resistive field plate of this example is different from the resistive field plate FP shown in FIG. 1 in planar layout of an intermediate resistive field plate.

Figure 17:
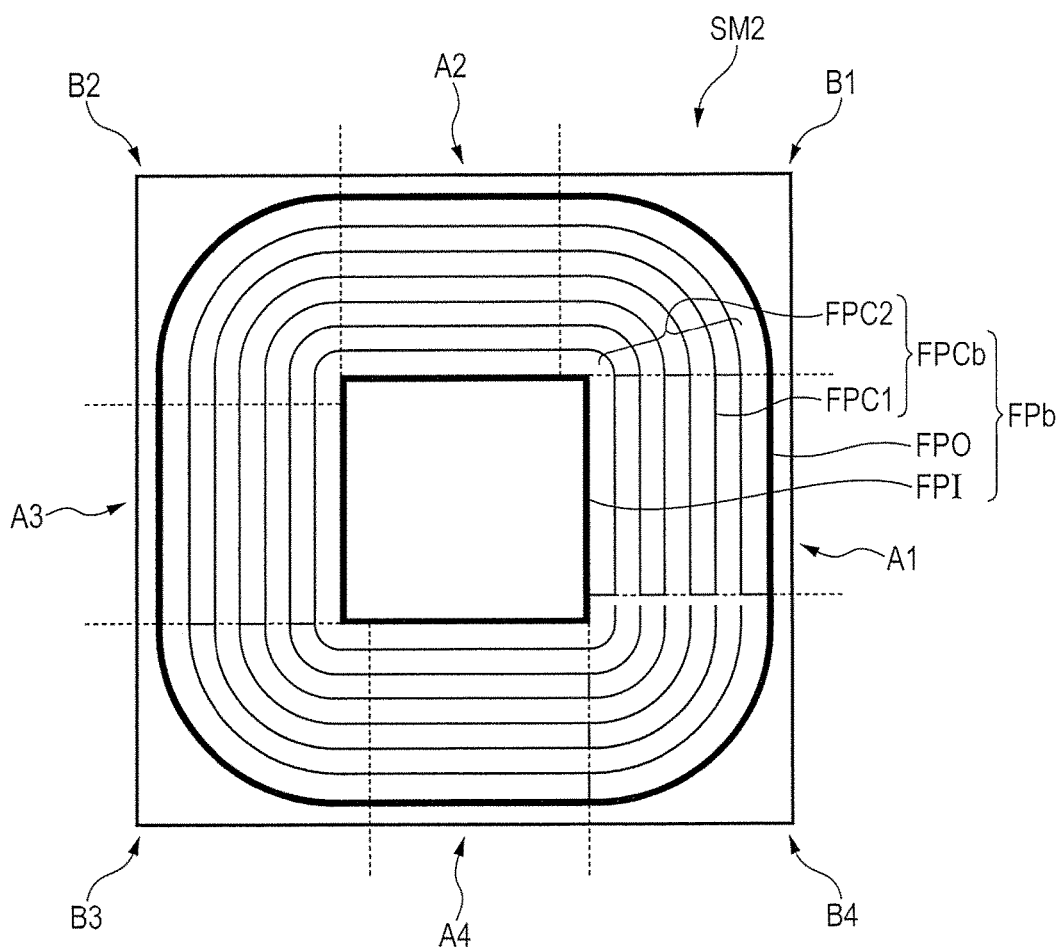
FIG. 17 is a plan view showing a resistive field plate formed in the peripheral portion of a semiconductor device of Second Modification Example of First Embodiment.

The planar layout of the resistive field plate according to Second Modification Example of First Embodiment will hereinafter be described referring to FIG. 17. FIG. 17 is a plan view showing the resistive field plate formed in the peripheral portion of a semiconductor device of Second Modification Example of First Embodiment.

In the resistive field plate FP shown in FIG. 1, four intermediate resistive field plates FPC comprised of four first intermediate resistive field plates FPC1 and a plurality of second intermediate resistive field plates FPC2 connected with each of them are coupled in parallel between an inner-circumferential-side resistive field plate FPI and an outer-circumferential-side resistive field plate FPO.

In Second Modification Example, in contrast, one intermediate resistive field plate FPCb comprised of a first intermediate resistive field plate FPC1 and a plurality of second intermediate resistive field plates FPC2 connected therewith is coupled between an inner-circumferential-side resistive field plate FPI and an outer-circumferential-side resistive field plate FPO.

The intermediate resistive field plate FPCb of the resistive field plate FPb formed in the peripheral portion of the semiconductor device SM2 has, in only one linear portion A1 thereof, a first intermediate resistive field plate FPC1.

The second intermediate resistive field plates FPC2 are connected with one end portion of six first portions of the first intermediate resistive field plate FPC1 placed in the linear portion A1 and they extend in one direction like a branch. These second intermediate resistive field plates FPC2 extend to the corner portion B1, the linear portion A2, the corner portion B2, the linear portion A3, the corner portion B3, the linear portion A4, and the corner portion B4. They are linear in the linear portions A2, A3, and A4, while they have a curvature in the corner portions B1, B2, B3, and B4. The other end portion (tip portion) of the plurality of second intermediate resistive field plates FPC2 is, in contrast, opened.

The plurality of second intermediate resistive field plates FPC2 has a fixed width, which is equal to that of the first intermediate resistive field plate FPC1. The plurality of second intermediate resistive field plates FPC2 has a pitch equal to that of the plurality of first portions of the first intermediate resistive field plate FPC1.

In the resistive field plate FPb of Second Modification Example similar to the above-described resistive field plate FP, the plurality of second intermediate resistive field plates FPC2 is not directly connected with the inner-circumferential-side resistive field plate FPI or the outer-circumferential-side resistive field plate FPO. In thermal equilibrium, therefore, an electric current flows only through the first intermediate resistive field plate FPC1 and does not flow through the second intermediate resistive field plates FPC2.

Therefore, it is free from the influence of a difference in resistance caused by a difference in curvature radius.

Further, the plurality of second intermediate resistive field plates FPC2 can make use of a potential of the first portions of the first intermediate resistive field plate FPC1 with which the second intermediate resistive field plates FPC2 are connected, respectively. The potential of the second intermediate resistive field plates FPC2 therefore becomes equal to that of the first portions of the first intermediate resistive field plate FPC1 with which the second intermediate resistive field plates FPC2 are connected so that the electric field distribution can be made uniform among the orbits even in the corner portions B1, B2, B3, and B4.

In the resistive field plate FPb, therefore, the electric field distribution becomes uniform among the orbits and the semiconductor device SM2 can be prevented from having a reduced breakdown voltage.

Further, the opened tip portion of the plurality of second intermediate resistive field plates FPC2 has a linear shape.

Since the second intermediate resistive field plates FPC2 have a linear opened tip portion, the risk of reduction in breakdown voltage due to the planar layout, shape, or manufacturing process of the resistive field plate FPb can be suppressed to the minimum, which is almost the same as that of the above-described resistive field plate FP.

The semiconductor device SM2 equipped with the resistive field plate FPb of Second Modification Example can have an improved breakdown voltage and at the same time, a reduced withstand voltage leakage current.

<Third Modification Example>

The resistive field plate of this example is different from the resistive field plate FP shown in FIG. 1 in planar layout of an intermediate resistive field plate.

Figure 18:
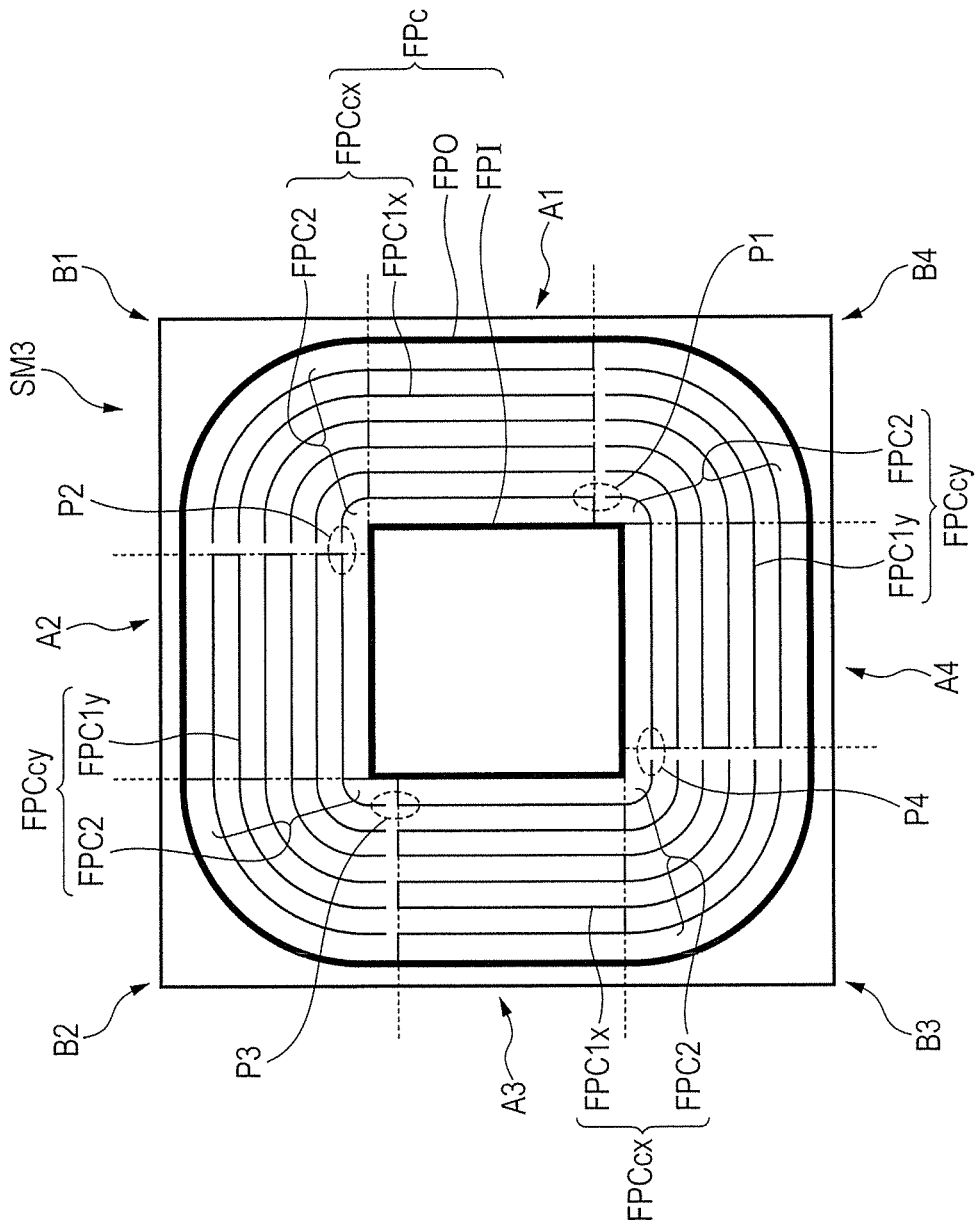
FIG. 18 is a plan view showing a resistive field plate formed in the peripheral portion of a semiconductor device of Third Modification Example of First Embodiment.

The planar layout of the resistive field plate according to Third Modification Example of First Embodiment will hereinafter be described referring to FIG. 18. FIG. 18 is a plan view showing the resistive field plate formed in the peripheral portion of a semiconductor device of Third Modification Example of First Embodiment.

In the resistive field plate FP shown in FIG. 1, one end of four first intermediate resistive field plates FPC1 is coupled to the inner-circumferential-side resistive field plate FP1 at equal intervals along the inner-circumferential-side resistive field plate FPI.

In Third Modification Example, in contrast, an intermediate resistive field plate FPCcx and an intermediate resistive field plate FPCcy different from each other in a coupling portion to the inner-circumferential-side resistive field plate FPI are placed alternately in the peripheral portion. The intermediate resistive field plate FPCcx is connected with the inner-circumferential-side resistive field plate FPI at an end portion opposite to an end portion where the second intermediate resistive field plate FPC2 and the first portion of the first intermediate resistive field plate FPC1x are connected. The intermediate resistive field plate FPCcy is connected with the inner-circumferential-side resistive field plate FPI at an end portion where the second intermediate resistive field plate FPC2 and the first portion of the first intermediate resistive field plate FPC1y are connected.

More specifically, the first intermediate resistive field plates FPC1x placed in the linear portion A1 and the linear portion A3, respectively, are coupled to the inner-circumferential-side resistive field plate FPI at an end portion of the first portion to which the second intermediate resistive field plate FPC2 is not coupled.

The first intermediate resistive field plates FPC1y placed in the linear portion A2 and the linear portion A4, respectively, are coupled to the inner-circumferential-side resistive field plate FPI at an end portion of the first portion to which the second intermediate resistive field plate FPC2 is coupled.

At positions shown by P1 and P3 in FIG. 18, therefore, generation of a potential difference can be suppressed between the first portion of the first intermediate resistive field plate FPC1x of the intermediate resistive field plate FPCcx and the second intermediate resistive field plate FPC2 of the intermediate resistive field plate FPCcy. In addition, at positions shown by P2 and P4 in FIG. 18, therefore, generation of a potential difference can be suppressed between the first portion of the first intermediate resistive field plate FPC1y of the intermediate resistive field plate FPCcy and the second intermediate resistive field plate FPC2 of the intermediate resistive field plate FPCcx.

The semiconductor device SM3 equipped with the resistive field plate FPc according to Third Modification Example can therefore have a further improved breakdown voltage because without an inflection point of a potential, a potential distribution can be made uniform.

<Fourth Modification Example>

The resistive field plate of this example is different from the resistive field plate FP shown in FIG. 1 in planar layout of an intermediate resistive field plate.

Figure 19:
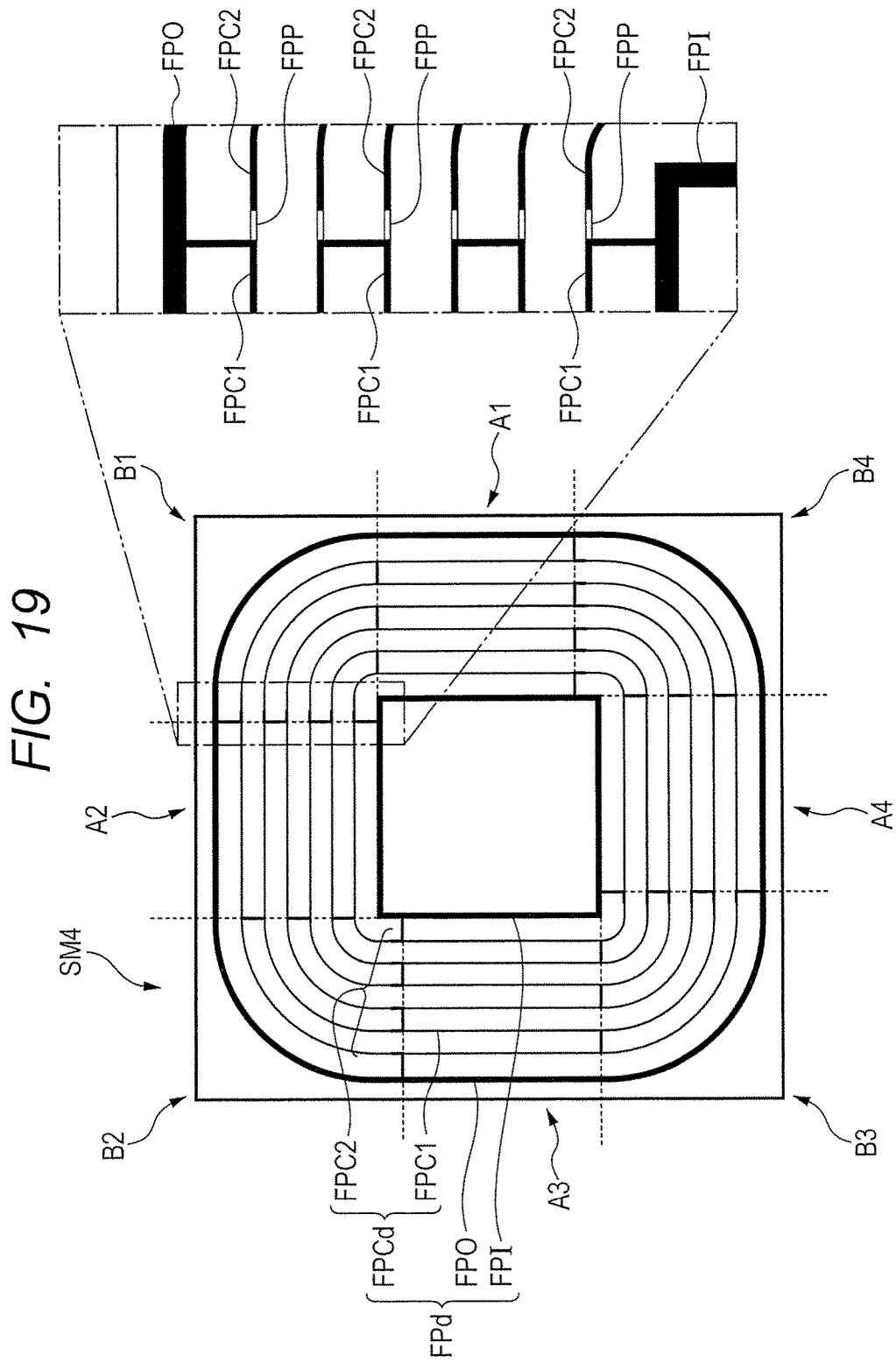
FIG. 19 is a plan view showing a resistive field plate formed in the peripheral portion of a semiconductor device of Fourth Modification Example of First Embodiment.

The planar layout of the resistive field plate according to Fourth Modification Example of First Embodiment will hereinafter be described referring to FIG. 19. FIG. 19 is a plan view showing the resistive field plate formed in the peripheral portion of a semiconductor device of Fourth Modification Example of First Embodiment.

In the resistive field plate FP shown in FIG. 1, four first intermediate resistive field plates FPC1 are separated from each other and are coupled to the inner-circumferential-side resistive field plate FPI and the outer-circumferential-side resistive field plate FPO in parallel.

In Fourth Modification Example, in contrast, as shown in FIG. 19, in intermediate resistive field plates FPCd adjacent to each other, a first portion of a first intermediate resist field plate FPC1 of one of the intermediate resistive field plates FPCd is coupled to a second intermediate resistive field plate FPC2 of the other adjacent intermediate resistive field plate FPCd to prevent the existence of an inflection point of a potential.

Described specifically, when the first intermediate resistive field plate FPC1 and the second intermediate resistive field plate FPC2 are made of N-type impurity-introduced polycrystalline silicon (Si), the first portion of the first intermediate resistive field plate FPC1 and the second intermediate resistive field plate FPC2 opposite to each other are connected by a coupling portion FPP made of P-type impurity-introduced polycrystalline silicon (Si). Although no electric current flows through the coupling portion FPP because of a PN junction formed at the coupling portion FPP, a potential difference difficulty occurs between the first portion of the first intermediate resistive field plate FPC1 and the second intermediate resistive field plate FPC2 opposite to each other.

More specifically, similar to the resistive field plate FP shown in FIG. 1, four intermediate resistive field plates FPCd comprised of four first intermediate resistive field plates FPC1 and a plurality of second intermediate resistive field plates FPC2 connected therewith respectively are placed in parallel. The first intermediate resistive field plates FPC1 and the second intermediate resistive field plates FPC2 are each made of, for example, N-type impurity-introduced polycrystalline silicon (Si).

The plurality of second intermediate resistive field plates FPC2 connected with a plurality of first portions of the first intermediate resistive field plate FPC1 placed in the linear portion A1, respectively, is connected with a plurality of first portions of the first intermediate resistive field plate FPC1 placed in the linear portion A2, respectively, via a coupling portion FPP made of, for example, P-type impurity-introduced polycrystalline silicon (Si).

Similarly, a plurality of second intermediate resistive field plates FPC2 connected with a plurality of first portions of the first intermediate resistive field plate FPC1 placed in the linear portion A2 is connected with a plurality of first portions of the first intermediate resistive field plate FPC1 placed in the linear portion A3, respectively, via a coupling portion FPP.

Similarly, a plurality of second intermediate resistive field plates FPC2 connected with a plurality of first portions of the first intermediate resistive field plate FPC1 placed in the linear portion A3 is connected with a plurality of first portions of the first intermediate resistive field plate FPC1 placed in the linear portion A4, respectively, via a coupling portion FPP.

Similarly, a plurality of second intermediate resistive field plates FPC2 connected with a plurality of first portions of the first intermediate resistive field plate FPC1 placed in the linear portion A4 is connected with a plurality of first portions of the first intermediate resistive field plate FPC1 placed in the linear portion A1, respectively, via a coupling portion FPP.

In the above description, the intermediate resistive field plate FPCd is made of N-type impurity-introduced polycrystalline silicon (Si) and the coupling portion FPP is made of P-type impurity-introduced polycrystalline silicon (Si). It may also be possible that the intermediate resistive field plate FPCd is made of P-type impurity-introduced polycrystalline silicon (Si) and the coupling portion FPP is made of N-type impurity-introduced polycrystalline silicon (Si).

Such a structure makes it difficult to cause a potential difference between, in the intermediate resistive field plates FPCd adjacent to each other, the first portion of the first intermediate resistive field plate FPC1 and the second intermediate resistive field plate FPC2 opposite to each other.

A semiconductor device SM4 equipped with the resistive field plate FPd according to Fourth Modification Example can have a further improved breakdown voltage, because a potential distribution can be made uniform without an inflection point of a potential.

(Second Embodiment)

The resistive field plate of this embodiment is different from the resistive field plate FP shown in FIG. 1 in planar layout of an intermediate resistive field plate and impurity concentration of the intermediate resistive field plate.

Figure 20:
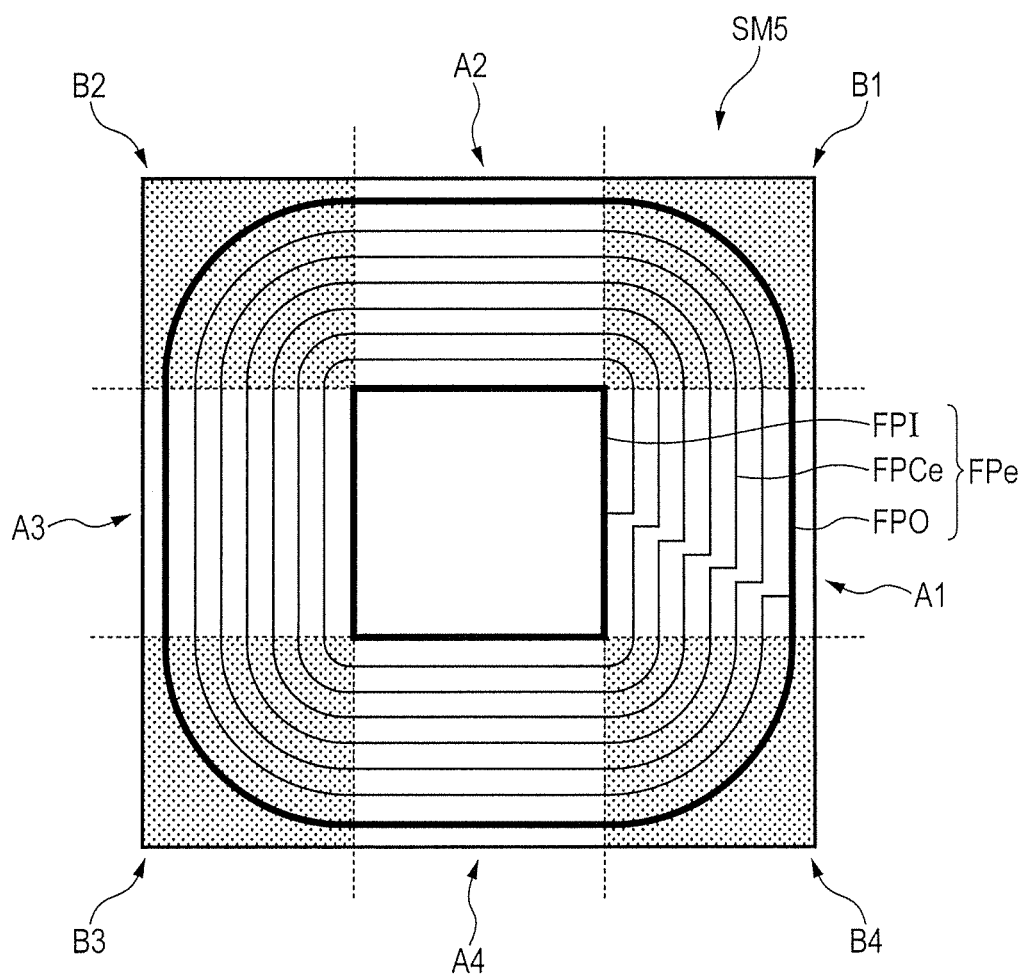
FIG. 20 is a plan view showing a resistive field plate formed in the peripheral portion of a semiconductor device of Second Embodiment.

The planar layout of the resistive field plate of Second Embodiment will hereinafter be described referring to FIG. 20. FIG. 20 is a plan view showing the resistive field plate formed in the peripheral portion of a semiconductor device of Second Embodiment.

In the resistive field plate FP shown in FIG. 1, four intermediate resistive field plates FPC comprised of four first intermediate resistive field plates FPC1 and a plurality of second intermediate resistive field plates FPC2 connected therewith, respectively, are coupled in parallel between the inner-circumferential-side resistive field plate FPI and the outer-circumferential-side resistive field plate FPO.

In Second Embodiment, in contrast, as shown in FIG. 20, an intermediate resistive field plate FPCe spirally wraps the active portion. One of the end portions of it is coupled to an inner-circumferential-side resistive field plate FPI, while the other end portion is coupled to an outer-circumferential-side resistive field plate FPO.

Further, the impurity concentration of polycrystalline silicon (Si) configuring the intermediate resistive field plate FPCe located in the corner portions B1, B2, B3, and B4 is made higher than that of polycrystalline silicon (Si) configuring the intermediate resistive field plate FPCe located in the linear portions A1, A2, A3, and A4.

This makes it possible to decrease the resistance of the intermediate resistive field plate FPCe in the corner portions B1, B2, B3, and B4 and make uniform, in the corner portions B1, B2, B3, and B4, the electric field distribution on the inner circumferential side and that on the outer circumferential side, and thereby increase the breakdown voltage.

Further, the withstand voltage leakage current can be reduced because of an increase in the resistance of the intermediate resistive field plate FPCe in the linear portions A1, A2, A3, and A4.

A semiconductor device SM5 equipped with the resistive field plate FPb according to Second Embodiment can therefore have an improved breakdown voltage and at the same time, have a reduced withstand voltage leakage current.

The invention made by the present inventors has been described specifically based on some embodiments. It is needless to say that the present invention is not limited to or by these embodiments and can be changed in various ways without departing from the gist of the invention.

What is claimed is:

1. A semiconductor device, comprising:
   a semiconductor substrate having a square shape in plan view;
   an active portion provided in the semiconductor substrate;
   a peripheral portion provided around the active portion; and
   a resistive field plate provided in the peripheral portion and surrounding the active portion,
   wherein the resistive field plate comprises:
      an outer-peripheral-side resistive field plate surrounding the active portion;
      an inner-circumferential-side resistive field plate surrounding the active portion, disposed between the outer-peripheral-side resistive field plate and the active region, and being spaced apart from the outer-peripheral-side resistive field plate; and
      an intermediate resistive field plate provided between the inner-circumferential-side resistive field plate and the outer-circumferential-side resistive field plate and electrically coupling the inner-circumferential-side resistive field plate to the outer-circumferential-side resistive field plate,
   wherein the intermediate resistive field plate comprises:
      a first intermediate resistive field plate; and
      a plurality of second intermediate resistive field plates,
   wherein one end of the first intermediate resistive field plate is coupled to the inner-circumferential-side resistive field plate, and another end of the first intermediate resistive field plate is coupled to the outer-circumferential-side resistive field plate,
   wherein the first intermediate resistive field plate connects the inner-circumferential-side resistive field plate and the outer-circumferential-side resistive field plate to each other, and has first portions separated from each other in a first direction and connection portions connecting the first portions to each other, each of the first portions extending in a second direction orthogonal to the first direction, and
   wherein the second intermediate resistive field plates have end portions respectively connected with first end portions of the first portions of the first intermediate resistive filed plate on one side of the first portions of the first intermediate resistive filed plate, have end portions opened on a side opposite to the end portions of the second intermediate resistive field plates connected with the first end portion of the first portions of the first intermediate resistive filed plate, and respectively extend at least with a curvature.

2. The semiconductor device according to claim 1, wherein portions of the second intermediate resistive field plates on the side opposite to the end portions of the second intermediate resistive field plates connected with the first end portion have a linear shape.

3. The semiconductor device according to claim 1, wherein the first portions of the first intermediate resistive field plate are equal in length.

4. The semiconductor device according to claim 1, wherein the first portions of the first intermediate resistive field plate are placed at equal pitch in the first direction.

5. The semiconductor device according to claim 1, wherein the first intermediate resistive field plate and the second intermediate resistive field plates are equal in width.

6. The semiconductor device according to claim 1, wherein in thermal equilibrium, an electric current does not flow through the second intermediate resistive field plates.

7. The semiconductor device according to claim 1, wherein the semiconductor substrate has, over a first main surface thereof, the resistive field plate via an insulating film, and
wherein the semiconductor substrate below the resistive field plate has a reduced surface field layer having a first depth from the first main surface.

8. The semiconductor device according to claim 1, wherein the active region has therein a plurality of insulated gate bipolar transistors (IGBTs), the inner-circumferential-side resistive field plate is electrically coupled to an emitter region of the IGBTs via a first electrode, and the outer-circumferential-side resistive field plate is electrically coupled to a collector region of the IGBTs via a second electrode.

9. The semiconductor device according to claim 1, wherein the number of the intermediate resistive field plate coupled in parallel between the inner-circumferential-side resistive field plate and the outer-circumferential-side resistive field plate is two,
wherein the peripheral portion includes four linear portions located along respective sides of the semiconductor substrate and four corner portions located on diagonal lines of the semiconductor substrate,
wherein the first intermediate resistive field plate is placed in two of the linear portions opposite to each other,
wherein the second intermediate resistive field plates are placed in the peripheral portion where the first intermediate resistive field plate is not placed, and
wherein the two intermediate resistive field plates enclose the active portion.

10. The semiconductor device according to claim 9,
wherein one of second end portions, on a side opposite to the first end portions, of the first portions placed at a position closest to the inner-circumferential-side resistive field plate is coupled to the inner-circumferential-side resistive field plate.

11. The semiconductor device according to claim 1,
wherein the number of the intermediate resistive field plate coupled between the inner-circumferential-side resistive field plate and the outer-circumferential-side resistive field plate is one,
wherein the peripheral portion includes four linear portions located along respective sides of the semiconductor substrate and four corner portions located on diagonal lines of the semiconductor substrate,
wherein the first intermediate resistive field plate is placed in one of the linear portions,
wherein the second intermediate resistive field plates are placed in the peripheral portion where the first intermediate resistive field plate is not placed, and
wherein the one intermediate resistive field plate enclose the active portion.

12. The semiconductor device according to claim 11,
wherein one of second end portions, on a side opposite to the first end portions, of the first portions placed at a position closest to the inner-circumferential-side resistive field plate is coupled to the inner-circumferential-side resistive field plate.

13. A semiconductor device, comprising:
a semiconductor substrate having a square shape in plan view;
an active portion provided by the semiconductor substrate;
a peripheral portion provided around the active portion; and
a resistive field plate provided in the peripheral portion and surrounding the active portion,
wherein the resistive field plate comprises:
an outer-peripheral-side resistive field plate surrounding the active portion;
an inner-circumferential-side resistive field plate surrounding the active portion, disposed between the outer-peripheral-side resistive field plate and the active region, and being spaced apart from the outer-peripheral-side resistive field plate; and
an intermediate resistive field plate provided between the inner-circumferential-side resistive field plate and the outer-circumferential-side resistive field plate and electrically coupling the inner-circumferential-side resistive field plate to the outer-circumferential-side resistive field plate,
wherein the intermediate resistive field plate comprises:
a first intermediate resistive field plate; and
a plurality of second intermediate resistive field plates,
wherein one end of the first intermediate resistive field plate is coupled to the inner-circumferential-side resistive field plate, and another end of the first intermediate resistive field plate is coupled to the outer-circumferential-side resistive field plate,
wherein the first intermediate resistive field plate connects the inner-circumferential-side resistive field plate and the outer-circumferential-side resistive field plate to each other, and has first portions separated from each other in a first direction and connection portions connecting the first portions to each other, each of the first portions extending in a second direction orthogonal to the first direction,
wherein the second intermediate resistive field plates have end portions respectively connected with first end portions of the first portions of the first intermediate resistive filed plate on one side of the first portions of the first intermediate resistive filed plate, and respectively extend at least with a curvature,
wherein four of the intermediate resistive field plates are coupled in parallel between the inner-circumferential-side resistive field plate and the outer-circumferential-side resistive field plate,
wherein the peripheral portion includes four linear portions located along respective sides of the semiconductor substrate and four corner portions located on diagonal lines of the semiconductor substrate,
wherein the first intermediate resistive field plate is placed in one or more of four the linear portions,
wherein the second intermediate resistive field plates are placed at least in the four corner portions, and
wherein the four intermediate resistive field plates enclose the active portion.

14. The semiconductor device according to claim 13,
wherein the four first intermediate resistive field plates are coupled, at the one ends thereof, to the inner-circumferential-side resistive field plate with an equal interval along the inner-circumferential-side resistive field plate.

15. The semiconductor device according to claim 13,
wherein one among second end portions, on a side opposite to the first end portions, of the first portions at a position closest to the inner-circumferential-side resistive field plate is coupled to the inner-circumferential-side resistive field plate.

16. The semiconductor device according to claim 13,
wherein the first intermediate resistive field plate coupled, at the first end portions of the first portions thereof placed at a position closest to the inner-circumferential-side resistive field plate, to the inner-circumferential-side resistive field plate and the first intermediate resistive field plate coupled, at second end portions on a side opposite to the first end portions of the first portions thereof placed at a position closest to the inner-circumferential-side resistive field plate, to the inner-circumferential-side resistive field plate, are arranged alternately in the peripheral portion.

17. The semiconductor device according to claim 13,
wherein the first intermediate resistive field plate and the second intermediate resistive field plates each have polycrystalline silicon of a first conductivity type, and
wherein in two of the intermediate resistive field plates adjacent to each other, second end portions, on a side opposite to the first end portions, of the first portions of the first intermediate resistive field plate configuring one of the intermediate resistive field plate and an opened end portion of the second intermediate resistive field plates configuring another intermediate resistive field plate, which are opposite to each other, are connected with each other via coupling portions having polycrystalline silicon of a second conductivity type different from the first conductivity type.

18. A semiconductor device, comprising:

a semiconductor substrate having a square shape in plan view;

an active portion provided at a center portion of the semiconductor substrate;

a peripheral portion provided around the active portion;

an outer-peripheral-side resistive field plate placed in the peripheral portion and enclosing the active portion;

an inner-circumferential-side resistive field plate placed in the peripheral portion, enclosing the active portion, disposed between the outer-peripheral-side resistive field plate and the active region, and being spaced apart from the outer-peripheral-side resistive field plate; and an intermediate resistive field plate provided in the peripheral portion between the inner-circumferential-side resistive field plate and the outer-circumferential-side resistive field plate, coupled, at one end, to the inner-circumferential-side resistive field plate and coupled, at another end, to the outer-circumferential-side resistive field plate, and spirally wrapping the active portion, wherein the peripheral portion includes four linear portions located along respective sides of the semiconductor substrate and four corner portions located on diagonal lines of the semiconductor substrate, and wherein the intermediate resistive field plate has polycrystalline silicon, and the polycrystalline silicon configuring the intermediate resistive field plate located in the corner portions has an impurity concentration higher than that of the polycrystalline silicon configuring the intermediate resistive field plate located in the linear portions.

\* \* \* \* \*